(12) United States Patent
Oda et al.

(10) Patent No.: US 7,095,043 B2
(45) Date of Patent: Aug. 22, 2006

(54) SEMICONDUCTOR DEVICE, SEMICONDUCTOR CIRCUIT MODULE AND MANUFACTURING METHOD OF THE SAME

(75) Inventors: Katsuya Oda, Hachioji (JP); Nobuyuki Sugii, Tokyo (JP); Makoto Miura, Kokubunji (JP); Isao Suzumura, Kokubunji (JP); Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/790,190

(22) Filed: Mar. 2, 2004

(65) Prior Publication Data
US 2004/0256613 A1    Dec. 23, 2004

(30) Foreign Application Priority Data
Jun. 18, 2003    (JP)    ............................ P2003-172912

(51) Int. Cl.
*H01L 29/06* (2006.01)
*H01L 31/0328* (2006.01)
(52) U.S. Cl. ........................... 257/19; 257/67; 257/69; 257/347; 257/E29.193
(58) Field of Classification Search ................ 257/19, 257/67, 69, 347
See application file for complete search history.

(56) References Cited

U.S. PATENT DOCUMENTS

2001/0045604 A1* 11/2001 Oda et al. .................. 257/350
2002/0146892 A1* 10/2002 Notsu et al. ................ 438/455

FOREIGN PATENT DOCUMENTS

| JP | 9-283533 | 10/1997 |
| JP | 2798576 | 7/1998 |

OTHER PUBLICATIONS

J. Kouvetakis, et al., "Novel Chemical Routes to Silicon-Germanium-Carbon Materials", Appl. Phys. Lett., vol. 65,No. 23, Dec. 5, 1994, pp. 2960-2962.

* cited by examiner

*Primary Examiner*—Tu-Tu Ho
(74) *Attorney, Agent, or Firm*—Antonelli, Terry, Stout and Kraus, LLP.

(57) ABSTRACT

An (SiGe)C layer having a stoichiometric ratio of about 1:1 is locally formed on an Si layer, a large forbidden band width semiconductor device is prepared inside the layered structure thereof and an Si semiconductor integrated circuit is formed in the regions not formed with the layered structure, whereby high frequency high power operation of the device is enabled by the large forbidden band width semiconductor device and high performance is attained by hybridization of the Si integrated circuit.

16 Claims, 16 Drawing Sheets

◎ C ATOM
◯ Si ATOM

◎ C ATOM
◯ Si ATOM
⦿ Ge ATOM

SEMICONDUCTOR DEVICE, SEMICONDUCTOR CIRCUIT MODULE AND MANUFACTURING METHOD OF THE SAME

BACKGROUND OF THE INVENTION

The present invention relates to a semiconductor device having a plurality of single crystal semiconductor layers each containing at least one of silicon (Si) and germanium (Ge), and carbon (C) as essential constituent elements and a method of manufacturing the same. The semiconductor device of the invention concerns a technique which is effectively applied to high frequency amplifying semiconductor devices and integrated circuits used in wireless communication apparatus and, further, a technique it is useful for use in broad forbidden band semiconductor devices for wireless communication in quasi-milliwave to milliwave regions.

Along with rapid popularization of mobile communication terminals and internet communication in recent years, wireless communication capacity has been increased rapidly year by year. Accordingly, necessary band width in the wireless communication has been extended and increase for the demand of communication apparatus intended for usual consumers is expected necessarily in higher frequency bands, that is, from quasi-milliwave to milliwave regions. Semiconductor devices used for electronic circuits in the frequency band described above are predominantly those using compound semiconductor materials represented by GaAs. Recently, SI carbide (hereinafter simply referred to as SIC) having broader forbidden width and more preferred electron transportation characteristics compared with GaAs has been investigated since it is applicable to higher power density at high frequency waves.

Existent methods of forming single crystal semiconductor layers containing Si, Ge, and C, were reported, for example, in Japanese Patent No. 2798576 (Paragraph 10, FIG. 1). In the manufacturing method of the prior art example, a gaseous starting material containing Si atoms, a gaseous starting material containing C atoms and a gaseous starting material containing Ge atoms are used. Further, such gaseous starting materials am thermally decomposed and grown into an Si epitaxial layer containing C and Ge at a vacuum degree of 10$-2 Torr or less capable of neglecting the gas phase reaction. Further, the prior art example shows that a substrate having, on its surface, at least an Si layer and a mask pattern formed on the Si layer is disposed in a gas phase growing vessel, and a gaseous starting material containing Si atoms, a gaseous starting material containing C atoms and a gaseous starting material containing Ge atoms are applied simultaneously to the surface of the substrate at a vacuum degree capable of neglecting the gas phase reaction to selectively grow the Si layer containing C and Ge only at the region on the substrate where the Si layer is exposed.

Further, an example of a method of forming a single crystal layer comprising Si, Ge, and C by using a single starting material gas is described in Applied Physics Letters, Vol. 65, pp 2960, 1994. A polycrystal layer with a Ge compositional ratio of 13% and a C compositional ration of 50% is grown by using tetrakis germane $(Ge(Si(CH_3)_3)_4)$ as the starting material gas.

Further, an existent example of a semiconductor device using a single crystal semiconductor layer containing Si, Ge, and C is also described in JP-A No. 9-283533 (Paragraph 25, FIG. 6). FIG. 19 shows the cross-sectional structure of a bipolar transistor of this example. A high concentration n-Si region 102 is grown on a p-Si substrate 101, an n-Si layer 103 is formed thereon as a collector region, on which a p-SiGe layer 104 as a base region and an n-SiGeC mixed crystal 105 as a an emitter region are grown. Each of the junction boundaries for the collector, the base and the emitter is formed by, e.g., the UHV/CVD process or the like so that relocation is not caused. As the starting gas for effecting epitaxial growth, an organic silane such as silane, disilane, or methyl silane, or an organic germane such as methyl germane and, optionally, ethylene is used. As the doping gas, arsenic or phosphorus is used as an n-impurity and boron or the like is used for a p-impurity.

Since SiC has a high melting point, it is extremely difficult to prepare a large diameter substrate by the pulling-up method as for the Si substrate. Accordingly, a method of forming a substrate by sublimation of a starting material is used. However, even use of the method still involves a drawback that a substrate having high crystal quality and a large area cannot be obtained.

Further, in a semiconductor integrated circuit for use in communication, not all of the circuits handle signals in a high frequency region since integrated circuits requiring information processing of a large capacity in a low frequency region are also necessary. For the integrated circuits, it is optimal to use existent Si semiconductor integrated circuits. Accordingly, a desirable integrated circuit is a combination of an SIC semiconductor device and an Si semiconductor device described above. In this case, while individual semiconductor chips can be mounted in one module, it is more preferred to manufacture born of the semiconductor devices on one and the same substrate. In order to attain the structure, it is necessary to form an SiC layer on an Si substrate.

Further, in the existent semiconductor device using the single crystal semiconductor layer containing Si, Ge, and C described above, the amount of C contained is small and it is of a diamond structure not a blende structure. The solid solubility of C in Si or SiGe mixed crystal as the diamond structure is several % or less, which involves a drawback that the crystallinity is worsened as the C compositional ratio is increased.

The manufacturing methods reported generally so far include the general drawbacks concerning the crystallinity as described above as well as the following drawbacks in fabricating the semiconductor device. In the semiconductor device using SiC for the active layer, it is difficult to dope SiC to a high concentration p-type, which involves drawbacks that a base resistance of a bipolar transistor cannot be formed, and that manufacture of a short channel device which is essential to the high-speed operation of a field effect transistor is difficult.

Further, the drawback in the field effect semiconductor device is that high-speed operation characteristics to be expected inherently for the SiC semiconductor cannot be achieved since the quality of the gate insulating film formed on the SiC surface is poor.

SUMMARY OF THE INVENTION

In view of the above, it is an object of the present invention to provide a semiconductor device capable of forming a single crystal layer with good crystallinity comprising Si, Ge, and C on an Si substrate and being combined with an SiC type or SiGe type semiconductor device, as well as a method of forming the same. Further, the invention can reduce the thickness of the single crystal layer.

It is another object of the invention to provide a technique for manufacturing a semiconductor device using a plurality of single crystal layers containing at least one of Si and Ge, and C, having a hetero structure capable of providing aimed high-speed characteristics by changing a forbidden band width.

A semiconductor device according to the present invention has the following features. That is, referring to a typical example of FIG. 1, a semiconductor device has at least a first single crystal layer 3 and a second single crystal layer 4 formed in an opening 6 in an insulating film 2 disposed on an Si single crystal substrate 1. Then, the first single crystal layer 3 and the second single crystal layer 4 each comprises one or both of Si and Ge, and C as essential constituent ingredients, have a single crystal (SiGe)C with a stoichiometric ratio of the sum of Si and Ge to C being about 1:1, and have respective forbidden band widths different from each other.

To be more specific, in the invention, it is at first important to selectively grow the semiconductor layer locally in the Si single crystal substrate. Distortion in the grown semiconductor layer is moderated by controlling the grown area of the semiconductor layer. As a result, lattice defect density in the semiconductor layer can be lowered. In the invention, substrates having an Si single crystal layer can be used as a substrate for crystal growing instead of the Si single crystal substrate. A typical example of the substrate having the Si single crystal layer is, for example, an SOI (Silicon On Insulator) substrate. Further, it is also possible, for example, to form a desired epitaxial layer on a semiconductor substrate and use the same as the substrate for crystal growing in the invention. In the present specification, the substrates having the Si single crystal layer applicable to the invention, as well as the substrates described above are referred to as "Si semiconductor substrate.

Another feature of the invention resides in a semiconductor device further having a third single crystal layer in addition to the first(single crystal layer 3 and the single crystal layer 4 formed in the opening of the insulating film 2 disposed on the Si semiconductor substrate 1, wherein all of the first single crystal layer, the second single crystal layer 4, and the third single crystal layer are single crystals (SiGe)C comprising-one or both of Si and Ge and C as the essential constituent ingredients thereof, with a stoichiometric ratio of about 1:1 between the sum of Si and Ge, and C and at least one of the first single crystal layer, the second single crystal layer and third single crystal layer has a forbidden band different from the other forbidden bands.

The semiconductor layer crystallographically grown locally of the invention is selected from at least two layers, three layers or, further, more layers depending on the demand of the semiconductor device. That is, the semiconductor layers crystallographically grown locally are selected depending on the case where the semiconductor device is, for example, a field effect semiconductor device or a hetero junction bipolar semiconductor device. Example of each of the first, second and third single crystal layers is selected depending on the demand of the semiconductor device described above.

Further, application of the invention tan attain, for example, an enhancement type field effect semiconductor device using Si type or (SiGe)C type. Manufacture of the enhancement type field effect semiconductor device using the material of the type described above has been actually difficult so far.

In view of the semiconductor device described above, it is preferred that the conductivity type is different between the second crystal layer and the third crystal layer. Further, the forbidden band width of the second crystal layer may be made smaller than that of the third single crystal layer.

In the constitution of the invention, electrons can be confined in the second single crystal layer for forming the semiconductor layer of smaller forbidden band width (that is, second single crystal layer) as a channel, by using the semiconductor layer of larger forbidden band width (that is, third single crystal layer) as a barrier layer. In this case, favorable ON-OFF characteristics can be obtained when both of the semiconductor layers are different from each other in conductivity type and a more specific example will be explained referring to Embodiment 4.

The following configuration is preferable for a field effect semiconductor device. A gate electrode is disposed on the second single crystal layer, and a current-flowing channel at a portion opposed to the gate electrode is formed of one or both of the first single crystal layer and the second crystal layer described above. In addition, source and drain regions are formed within a main plane of a hetero junction formed from the first single crystal layer and the second single crystal layer so as to come into electrical contact with the channel.

Further, it is possible to form a buried channel structure by forming a channel in the layer of a smaller forbidden band width for the first single crystal layer and the second crystal layer, forming a layer of larger forbidden band width above the channel layer and, further forming a gate electrode thereon.

Preferably, an insulating film having an opening is formed on a p-doped Si semiconductor substrate, a first single crystal layer is formed in the opening, a second single crystal layer is formed on the first single crystal layer, and thus, a layered structure containing one or both of them is formed. A gate electrode is formed on the second crystal layer, a channel for flowing current is formed at a portion facing a gate electrode in one or both of the first single crystal layer and the second crystal layer. Source and drain regions are formed in the main surface of the layered structure so as to make electrical contact with the channel.

In this case, the first single crystal layer and the second single crystal layer may each be a single crystal (SiGe)C layer with a stoichiometric ratio of the sum of Si and Ge to C being about 1:1.

In any of the semiconductor devices described above, preferably an SiGeC layer comprising one or both of SiGe and C as essential constituent ingredients is disposed between the Si semiconductor substrate and the first single crystal layer, and the lattice constant of the semiconductor substrate and that of the first single crystal layer is successively changed to a level therebetween. That is, the SiGeC layer described above is used as the so-called buffer layer in this embodiment.

In any of the semiconductor devices described above, the plane direction of the Si semiconductor substrate is preferably about (100).

(SiGe)C includes crystal polyforms (that is, different crystal structures for identical composition). Accordingly, use of the Si (100) as a substrate provides a merit of easily growing desired (SiGe)C crystals. Further, use of the Si (100) substrate also has a merit capable of obtaining optimum characteristics by forming the Si semiconductor substrate on the (100) face. It will be apparent that other crystal faces may also be used in the invention.

As described previously, it is extremely useful to use the invention for one of semiconductor devices in an integrated circuit using a semiconductor device using Si for an operation active layer and, particularly, a semiconductor device for processing high frequency signals together. That is, this is an example in which one of the semiconductor devices described above and the semiconductor device using the Si for the operation active layer are formed on one and the same substrate.

It is possible to constitute a semiconductor circuit module by using any of the semiconductor device or the semiconductor integrated circuit of the invention as a main constituent part and provide, for example, a semiconductor integrated circuit for communication use.

Then, a manufacturing method is to be described. The outline for the method of manufacturing the semiconductor device according to the invention comprises the following steps for the semiconductor device described above. That is, the method comprises the steps of forming an insulative layer having an opening on an Si semiconductor substrate, forming a first single crystal layer in the opening, and forming a second single crystal layer on the first single crystal layer, in which the first single crystal layer and the second single crystal layer each comprises a single crystal (SiGe)C layer having one or both of Si and Ge, and C as main ingredients and having a stoichiometric ratio of the sum of Si and Ge to C being about 1:1, and the forbidden band width of the first crystal layer is different from that of the second single crystal layer.

Further, another method of manufacturing a semiconductor device comprises the steps of forming an insulating film having an opening on an Si substrate semiconductor substrate, forming a first single crystal layer in the opening, forming a second single crystal layer on the first single crystal layer, and forming a third single crystal on the second single crystal layer, in which the first single crystal layer, and the second single crystal layer, and the third single crystal layer each comprises one or both of Si and G, and C as the main ingredients and having a stoichiometric ratio of the sum of Si and Ge to C being about 1:1, and the forbidden band width of at least one of the first single crystal layer, the second single crystal layer, and the third single crystal layer is different from those of the other layers.

What is important in the method of manufacturing the invention is to use an organic gas having an Si atom-C atom bond and, further, use an organic gas having a Ge atom-C atom bond as a starting gas for effecting epitaxial growth of each of the semiconductor layers. Thus, when the (SiGe)C layer is crystallographically grown, it is possible to achieve crystal growing with SiC bond and Ge-C bond maintained. This enables to obtain a single crystal (SiGe)C layer with the stoichiometric ratio of the sum of Si and Ge to C being about 1:1.

The growing temperature in the epitaxial growing of the multi-layered structure depends naturally on the kind of the starting gases used and the requirement for the growing speed and a temperature from 500 to 900° C. is often used. Further, also the growing pressure used for the epitaxial growing also depends on the kind of the starting gases and the requirement for the growing speed and a pressure from 0.1 to 10,000 Pa is often used.

DESCRIPTION OF THE ACCOMPANYING DRAWINGS

Preferred embodiments of the present invention will be described in details based on the drawings, wherein FIG. 1 is a cross-sectional view of a semiconductor device according to Embodiment 1 of the invention;

DESCRIPTION OF THE PREFERRED EMBODIMENTS

Figure 1:
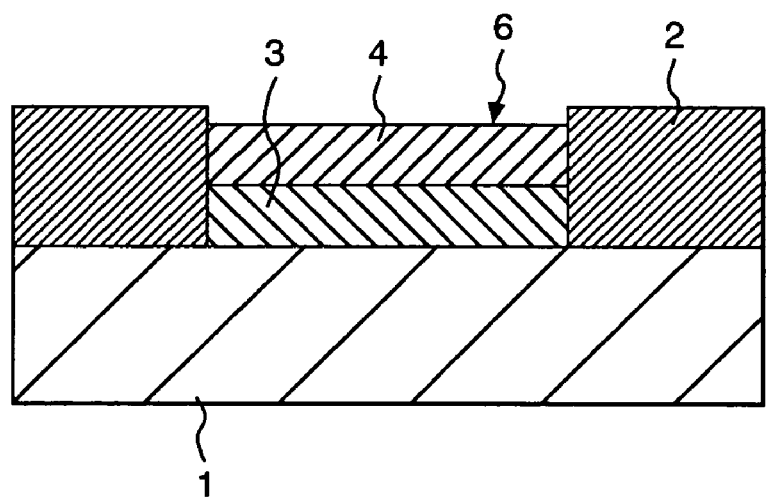

Preferred embodiments of the semiconductor device according to the present invention are as follows: A practical method of forming a multi-layered structure comprising a single crystal (SiGe)C layer is that an insulating film having an opening is used to form the multi-layered structure in the opening.

An insulating film having an opening is formed on an Si substrate, and a multi-layered structure is formed which comprises a plurality of single crystal (SiGe)C layers containing Si, Ge, and C as essential constituent ingredients, and which has the stoichiometric ratio of the sum of Si and Ge to C being about 1:1. Then, at least one of the plurality of single crystal (SiGe)C layers constituting the multi-layered structure has a forbidden band width different from the others. That is, the multi-layered structure has a hetero junction.

Since the single crystal (SiGe)C grows while keeping the blende structure by maintaining the stoichiometric ratio at about 1:1, crystallinity of the single crystal layer can be improved. Accordingly, it is possible to suppress the occurrence of leak current in the semiconductor device and improve the yield. In addition, by controlling the compositional ratio for Si and Ge to change the forbidden band width, a hetero junction can be prepared with a semiconductor having a broader forbidden band width than Si. Accordingly, characteristics of high saturation electron speed and high break down electric field inherent to SiC crystals are satisfied and, on the other hand, hetero junction with SiC crystals is enabled by the growing of (SiGe)C crystals. Thus, in the semiconductor device according to the invention, higher speed operation and high voltage withstanding can be compatible.

Further, a preferred embodiment for the method of manufacturing a semiconductor device according to the invention is characterized by using a gas containing a Si atom-C atom bond and a gas having a Ge atom-C atom bond for the starting material for forming the single crystal (SiGe)C layer. Since the (SiGe)C layer grows while keeping the Si—C bond and Ge—C bond by the growing method described above, crystals can be grown easily while maintaining the blende structure and the crystallinity of the grown single crystal layer can be improved.

Further, a preferred embodiment for the method of manufacturing the semiconductor device according to the invention is characterized in that the temperature is 500° C. or higher and 900° C. or lower and the pressure is not higher than 10,000 Pa when the single crystal (SiGe)C layer constituting the multi-layered structure is formed by epitaxial growing. By performing the process under the epitaxial growing condition described above, the single crystal (SiGe)C layer can be formed in the opening while keeping the selectivity, in forming the single crystal layer.

[Comparison with the Existent Manufacturing Method]

Generally, in the existent method of forming single crystal semiconductor layers containing Si, Ge, and C, reported so far, growing is conducted by using a gaseous starting material containing Si, a gaseous starting material containing C and a gaseous starting material containing Ge. This process involves a drawback that C tends to cause clustering and generates a great amount of crystal defects. This is because the covalent bond formed with C is extremely strong compared with covalent bond of Si or Ge.

Further, in the existent growing method of forming the single crystal layer comprising Si, Ge, and C by using the single starting material gas described above, since the growing proceeds while the single gas is decomposed, the ratio of Si, Ge, and C contributing to the growing is the same and the Ge compositional ratio or the C compositional ratio in the grown semiconductor layer can not be controlled. Accordingly, this involves a drawback that a hetero structure using a multi-layered film of different compositional ratios cannot be formed.

As described above according to the invention, since the (SiGe)C layer is grown while maintaining the Si—C bond and the Ge—C bond by the epitaxial growing method using the organic gas having the Si atom-C atom bond and an organic gas having the Ge atom-C atom bond, the drawbacks described above can be avoided.

Further embodiments for the semiconductor device according to the present invention and the manufacturing method thereof are to be described specifically with reference to the accompanying drawings.

Embodiment 1

FIG. 1 is a cross-sectional view showing an embodiment of a semiconductor device according to the present invention. An insulating film 2 having an opening 6 comprising a silicon oxide film is formed on an Si substrate 1. An n-(SiGe)C layer 3 and a p-(SiGe)C layer 4 are formed successively in the opening 6 of the insulating film. In this embodiment, the n-(SiGe)C layer 3 corresponds to the first semiconductor single crystal layer while the p-(SiGe)C layer 4 corresponds to the second semiconductor single crystal layer in the present specification. As described above, the first single crystal layer and the second single crystal layer may each be a single crystal (SiGe)C layer comprising one or both of Si and Ge, and C as essential constitution ingredients, and having a stoichiometric ratio of the sum of Si and Ge to C being substantially 1:1.

Figure 20:
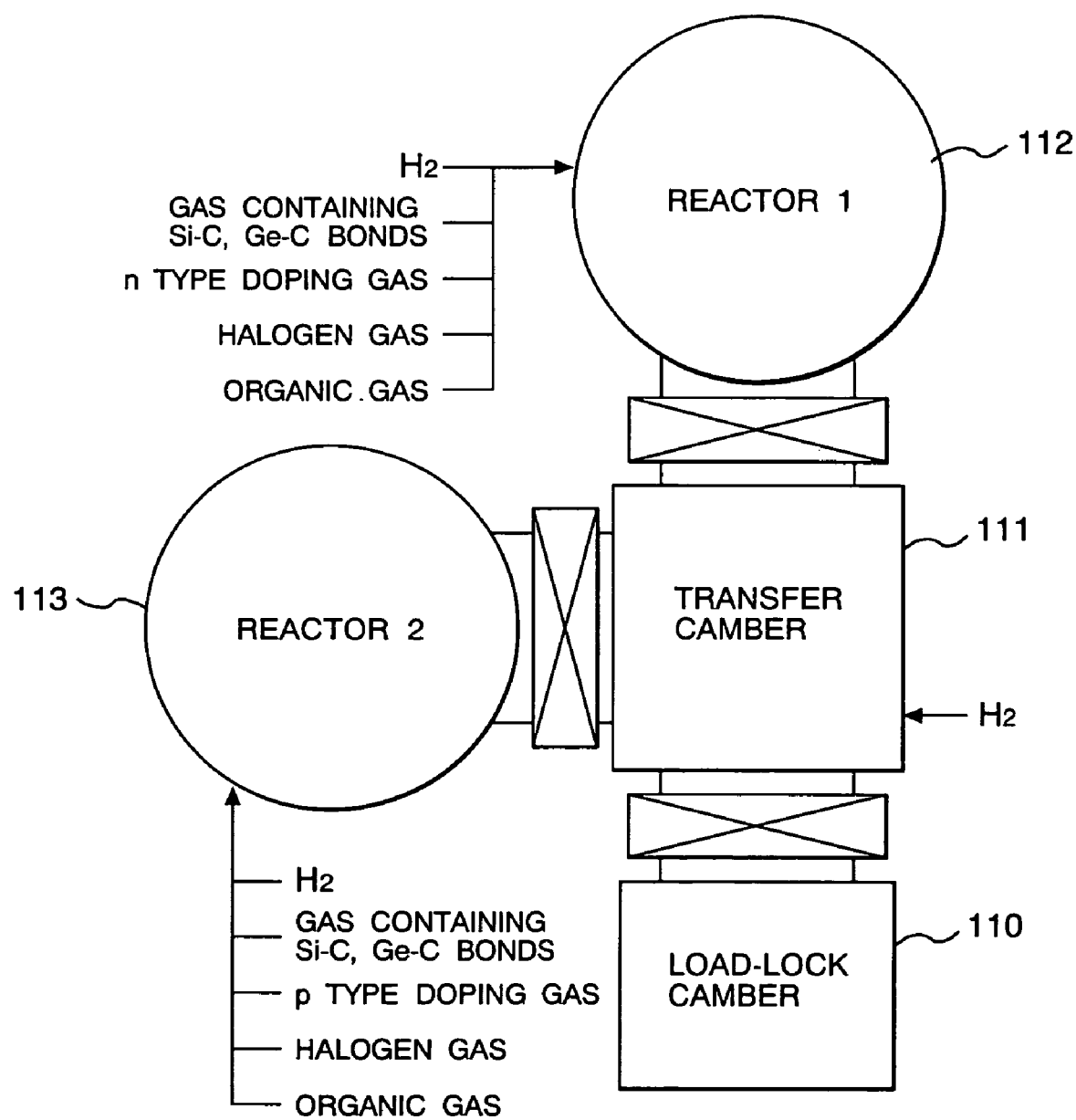
FIG. 20 is a schematic block diagram of a crystal growing apparatus.

Details of the method of growing the semiconductor single crystal layer according to the invention is to be described with reference to this embodiment. The growing method to be described herein is naturally applicable to other embodiments as well as to the method of growing the semiconductor single crystal layer in the invention. FIG. 20 shows a schematic block diagram of a crystal growing apparatus. The apparatus comprises a load lock chamber 110, a transfer chamber 111, a growing chamber 1 (112) and a growing chamber 2 (113). An exhaustion system and the like are not illustrated and introduction of various kinds of gases are indicated by arrows. Introducible main gases are shown in the drawing.

[Treatment Before Single Crystal Growing]

[Washing]

At first, in order to previously remove contaminants or spontaneous oxide films on the surface of a substrate, the substrate is washed. For example, contaminates due to heavy metals or organics on the surface, as well as particles adhered to the surface of the particles can be removed by washing the substrate with a heated liquid mixture of ammonia, hydrogen peroxide and water. Then, oxide films formed on the surface of the substrate during the washing with the liquid mixture of ammonia, hydrogen peroxide and water are removed by an aqueous hydrofluoric acid solution, and then washing is applied immediately thereafter to coat the surface of the Si substrate with hydrogen atoms. In this state, since Si atoms present on the uppermost surface of the substrate are bonded with hydrogen, spontaneous oxide films are less formed on the surface after the washing of the substrate till the start of the growing. In addition to the hydrogen termination treatment for the surface of the substrate with the washing, the substrate is washed in order to further prevent formation of the spontaneous oxide films on the surface. In addition, it is preferred to transfer the Si substrate in wash nitrogen in order to prevent re-oxidation on the surface of the substrate and prevent deposition of contaminants. The methods of washing and transferring the substrate performed before epitaxial growing are similarly carried out in the following embodiments.

[Cleaning]

Then, the washed substrate is set in the load lock chamber 110 and evacuation for the load lock chamber 110 is started. After the evacuation for the load lock chamber 110 is completed, the Si substrate is transferred by way of the transfer chamber 111 to the growing chamber 1 (112). In order to prevent contaminates from depositing on the surface of the substrate, it is preferred that the transfer chamber 111 and the growing chamber 1 (112) are in a high-vacuum state or a super high-vacuum state. The vacuum state is, preferably, at a pressure of about $1 \times 10^{-5}$ Pa or lower. Also the degree of vacuum holds true for the growing chamber 2 (113) to be described later. Further, in order to prevent occurrence of crystal defects caused by intake of oxygen or C in the single crystal layer formed in the growing chambers, it is necessary to prevent intrusion of oxygen, water content or gas containing organic contaminants to the transfer chamber 111, the growing chamber 1 (112) and growing chamber 2 (113). In view of the above, it is preferred that the transfer of the Si substrate is started after the pressure in the load lock chamber 110 lowers to about $1 \times 10^{-5}$ Pa or less.

Since formation of oxide films or deposition of contaminants to the surface during transfer cannot be prevented completely even when the surface of the Si substrate is put to the hydrogen termination treatment, the surface of the Si substrate is cleaned before epitaxial growing.

The typical cleaning methods include the following methods. (1) An method of forming the semiconductor substrate in a vacuum, (2) a method of heating the substrate in a state of supplying hydrogen, and (3) a method of heating in a state of supplying atomic hydrogen.

(1) Method of Heating Semiconductor Substrate in a Vacuum

For example, the spontaneous oxide films on the surface of the substrate can be removed by heating the Si substrate in a vacuum by the following reaction:

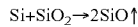

$$Si+SiO_2 \rightarrow 2SiO\uparrow$$

(2) Method of Heating While Hydrogen is Supplied to the Substrate

Alternatively, the surface of the substrate can be cleaned also by heating the Si substrate in a state of supplying clean hydrogen into the growing chamber 1 (112). In the cleaning by the heating in a vacuum described previously, hydrogen terminating the surface of the substrate is dissociated when the temperature of the substrate exceeds about 500° C., and Si atoms exposed to the surface of the substrate reacts with water content and oxygen contained in the atmosphere in the growing chamber to re-oxidize the surface of the substrate. Then, when the oxide film is reduced again, a problem arises which increases the unevenness on the surface of the substrate along with cleaning. This worsens the uniformness and the crystallinity in the epitaxial growing conducted subsequently. Further, since carbonic gases or organic gases contained in the atmosphere of the growing chamber are deposited on the surface simultaneously, worsening in the crystallinity of the epitaxially grown layer also occurs due to C contamination.

On the other hand, in a case of heating the Si substrate in a state of supplying hydrogen to the surface of substrate, even when hydrogen has been dissociated from the surface of the substrate at a temperature of 500° C. or higher, since the clean hydrogen gas is always supplied, Si and hydrogen on the surface of the substrate repeat bonding and dissociation. As a result, surface Si is less oxidized, no surface unevenness occurs during cleaning and it is possible to obtain a clean surface state.

In order to perform cleaning in a hydrogen atmosphere, a hydrogen gas is at first supplied to the growing chamber 1 (112). In this step, to prevent the hydrogen from dissociating from the substrate surface before supplying the hydrogen gas, it is preferred that the temperature for the substrate is made lower than 500° C. at which hydrogen is dissociated. Further, it is preferred that the flow rate of the hydrogen gas is 10 ml/minor or more so that the gas can be supplied with good controllability, and is 100 l/min or less for treating the discharged gas safely. In this case, the lower limit for the partial pressure of the hydrogen gas in the growing chamber 1 (112) is set to 10 Pa such that a gas can be supplied uniformly to the surface of the substrate and the upper limit thereof may be an atmospheric pressure in order to keep the safety of the apparatus. After supply of the hydrogen gas, the Si substrate is heated to the cleaning temperature. For the heating method, any mechanism or structure may be adopted so long as there is no contamination on the Si substrate when it is heated or no extreme variations in temperature in the substrate. For example, induction heating of applying high frequency waves to work coils for heating or heating by an ohmic heater can be applied. In addition, a heating method utilizing radiation from lamps can be used as a method capable of controlling the temperature in a short time. The heating method is applicable to the heating performed at the time of growing the single crystal described later in addition to that for the cleaning.

After heating the Si substrate to the cleaning temperature, the substrate is heated for a predetermined period of time by which the spontaneous oxide films or contaminants on the surface can be removed. The cleaning temperature may be, for example, 600° C. or higher as a temperature capable of obtaining the cleaning effect and it is preferred to set the temperature to 1000° C. or lower at which diffusion of dopants in the substrate becomes remarkable by the heat treatment. Further, to decrease the effect on the structure formed before epitaxial growing, it is necessary that the cleaning temperature is as low as possible.

(3) Method of Heating in a State of Supplying Atomic Hydrogen

As a method capable of lowering the cleaning temperature, cleaning can be performed also by using atomic hydrogen. In this method, oxygen-reducing reaction can be taken place even when the substrate temperature is not increased by applying active hydrogen atoms to the surface of the substrate, and the cleaning effect can be obtained even at room temperature.

For example, when molecules of hydrogen are dissociated into an atomic state at a certain ratio in the hydrogen gas and applied to the surface of the substrate, temperature lowering is possible. For example, the cleaning temperature may be at 650° C. for restricting the cleaning time within 10 min.

While the description has been made of the cleaning using hydrogen, a gas having an etching effect to silicon oxides such as hydrogen fluoride can also be supplied as other method. The cleaning method is applied in the same manner also to other embodiments.

[Preparation for Epitaxial Growing]

After completing the cleaning, the temperature of the substrate is lowered to a level for conducting epitaxial growing and a time is provided for stabilizing the substrate temperature at a level of conducting epitaxial growing. In the step of stabilizing the temperature, it is desirable to keep the hydrogen gas supply in order to keep the surface of the Si substrate clean after cleaning. However, since the hydrogen gas has an effect of cooling the surface of the substrate, the surface temperature of the substrate changes in accordance with the gas flow rate providing that the heating condition is the same. Accordingly, even when the temperature is stabilized in a state of supplying a hydrogen gas at a flow rate greatly different from the total flow rate of the gases used in the epitaxial growing, the gas flow rate changes at the instance the epitaxial growing is started to greatly change the substrate temperature. In order to prevent this phenomenon, it is desirable in the step for stabilizing the substrate temperature that the hydrogen flow rate about at the same level as that for the total flow rate of the gas used for epitaxial growing is used. Further, it is not always necessary to provide a step of conducting temperature stabilization after the substrate temperature has been lowered to the epitaxial growing temperature but it is preferred that the flow rate of the hydrogen gas is controlled while lowering the substrate temperature, and the flow rate of the hydrogen gas is equal with the flow rate of the growing gas at the instance the substrate temperature reaches the epitaxial growing temperature. In this case, since the epitaxial growing can be started simultaneously with the lowering of the substrate temperature, throughput can be improved remarkably.

[Epitaxial Growing]

Then, the hydrogen gas supplied during temperature stabilization is stopped and, at the same time, a starting material gas and an n-doping gas for the epitaxial layer are supplied to start the epitaxial growing of the n-single crystal (SiGe)C layer 3. Examples of the carrier gas include $H_2$.

As the starting gas used herein, a compound having Si—C bond and Ge—C bond can be used.

Embodiments of the gas having the Si—C bond include monomethyl silane ($CH_3SiH_3$), dimethyl silane (($CH_3)_2SiH_2$)), trimethyl silane (($CH_3)_3SiH$), tetramethyl silane (($CH_3)_4Si$), diethyl silane (($C_2H_5)_2SiH_2$), triethyl silane (($C_2H_5)_3SiH$), tetraethyl silane (($C_2H_4)_4Si$), methyltrichloro silane ($CH_3SiCl_3$), dimethyldichloro silane (($CH_3)_2SiCl_2$), and trimethylchloro silane (($CH_3)_3SiCl$).

Embodiments of the gas containing the Ge—C bond include methyl germane ($CH_3GeH_3$), dimethyl germane (($CH_3)_2GeH_2$)), tetramethyl germane (($CH_3)_4Ge$), diethyl germane (($C_2H_5)_2GeH_2$), tetraethyl german (($C_2H_5)_4Ge$), methyl germanium trichloride ($CH_3GeCl_3$), dimethyl germanium dichloride (($CH_3)_2GeCl_2$), ethyl germanium trichloride ($C_2H_5GeCl_3$), and triethyl germanium chloride (($C_2H_5)_3GeCl$).

For the n-doping gas, compounds comprising group 5 element, and carbon, hydrogen, chlorine, fluorine, etc. can be used. Examples of the gas include phosphine ($PH_3$), trimethyl phospine (($CH_3)_3P$), triethyl phospine (($C_2H_5)_3P$), phosphorus trichloride ($PCl_3$), phosphorus trifluoride ($PF_3$), arsine ($AsH_3$), diethyl arsine ($C_2H_5)_2AsH$), diethyl arsine chloride (($C_2H_5)_2AsCl$), trimethyl arsine (($CH_3)_3As$) triethyl arsine (($C_2H_5)_3As$), arsenic trichloride ($AsCl_3$), ammonia ($NH_3$), diethyl amine (($C_2H_5)NH$), triethyl amine (($C_2H_5)_3N$), and trimethyl amine (($CH_3)_3N$).

Figure 3A:
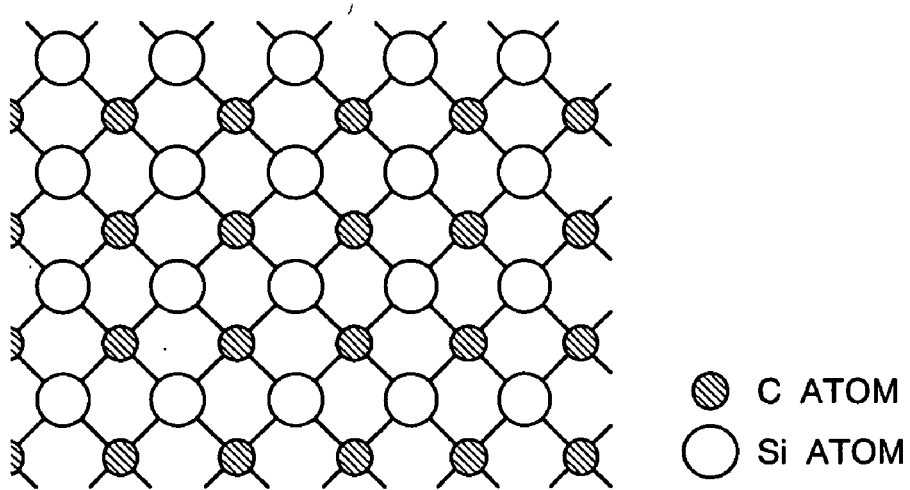
FIGS. 3A and 3B are schematic sectional diagrams each showing a crystal structure of the semiconductor device according to Embodiment 1 of the invention.
Figure 3B:
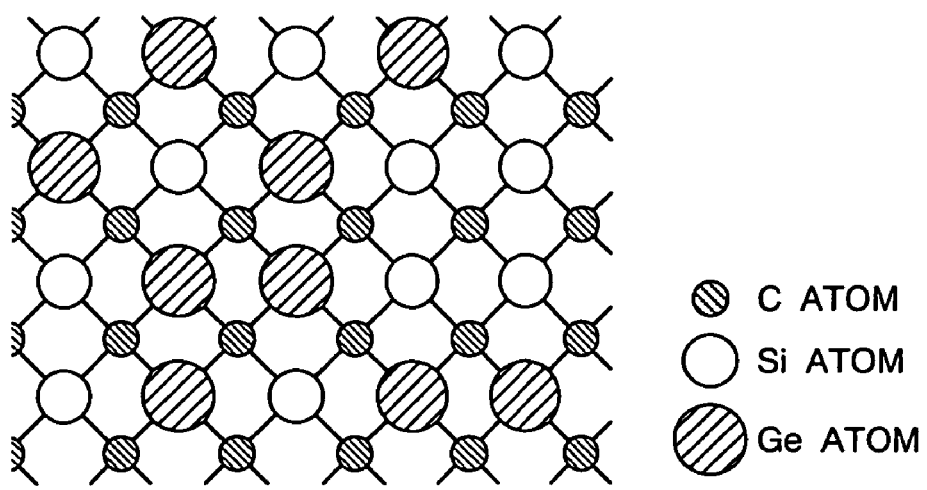

For example, in a case of using $CH_3SiH_3$ as the starting gas and an Si substrate having a plane direction of (100) as the substrate, $CH_3SiH_3$ is decomposed on the Si substrate and grown while keeping the Si—C bond. In SiC of the blende type crystal structure, since the difference of bound energy is large between the Si atom and the C atom, polarity is generated although they are elements of identical group IV, and an atomic layer comprising C and an atomic layer comprising Si are grown while being laminated alternately as shown in FIG. 3A. Simultaneously, in a case of using $CH_3SiH_3$ and $CH_3GeH_3$ as the starting gas, $CH_3SiH_3$ and $CH_3GeH_3$ are decomposed on the Si substrate and they grow while keeping the Si—C bond and the Ge—C bond. Like SiC, since the difference of the bound energy of electrons is large also between the Ge atom and the C atom, polarity is generated simultaneously with growing and an atom layer comprising C and an atom layer comprising $Si_{1-x}Ge_x$ as an Si—Ge mixed crystal are grown while being laminated alternately. Since Si and Ge form entirely solid solubilized mix crystals, the Ge compositional ratio can be varied freely in the $Si_{1-x}Ge_x$ layer. In this state, since the state of electrons in the (SiGe)C layer changes in accordance with the Ge compositional ratio, the forbidden band width of the (SiGe)C layer changes in accordance with the Ge compositional ratio.

When the single crystal SIC layer is formed by selective epitaxial growing to the opening in the Si oxide film formed on the Si substrate, the starting gas reacts with the surface molecules on the Si oxide film in the following reactive manner. For example, in a case of using $CH_3SiH_3$ as the starting gas, the reducing reaction:

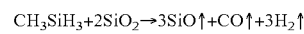

takes place. Further, in a case of using $CH_3GeH_3$, the reducing reaction:

takes place. Further, the situation is identical in a case of using other starting gases.

The reducing reactions are a portion of various reactions and, in addition, the reducing reaction between the radical molecules formed by decomposition of the starting gas into a high-energy state and the oxide film is also present. As a result, etching by the reducing reaction and deposition caused by the decomposition of the starting gas proceed simultaneously on the oxide film and the magnitude relation between the etching and the deposition changes depending on the growing temperature and the pressure. Since only the reducing reaction described above provides the limit of the film thickness capable of keeping the selectivity, in a case of the selective epitaxial growing of a relatively thick single crystal (SiGe)C layer, the (SiGe)C layer is etched by adding a halogen type gas such as a chlorine gas (Cl) or hydrochloride gas (HCl) in addition to the starting gas. The reaction includes as follows:

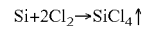

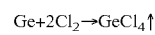

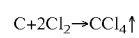

$$Si + 2HCl \rightarrow SiH_2Cl_2 \uparrow$$

$$Ge + 2HCl \rightarrow GeH_2Cl_2 \uparrow$$

$$C + 2HCl \rightarrow CH_2Cl_2 \uparrow$$

As a result of simultaneous proceeding of the reactions described above, the (SiGe)C layer is not deposited on the Si oxide film in a state where the selectivity is maintained.

The temperature range for conducting the epitaxial growing is 500° C. or higher where selectivity for the Si oxide film and the Si nitride film, and single crystals is obtained favorably and the decomposition of the starting gas is caused and 900° C. or lower where the surface morphology is favorable and characteristic of the semiconductor device formed on one and the same substrate is less deteriorated. Within the temperature range, the growing pressure may be 0.1 Pa or higher at which the growing speed is restricted by the reaction on the surface, and 10,000 Pa or less at which the reaction in a gas phase starts. Also the same selective epitaxial growing conditions of the single crystal (SiGe)C layer are applicable to the following embodiments.

Then, an aspect of the relation between epitaxial growing and distortion or strain is to be described.

In a case of growing, for example, an SiC layer with a Ge compositional ratio of 0% on an Si substrate, since the lattice constant of the SiC layer is smaller by about 20% than the lattice constant of the Si substrate, the SiC layer grows with distortion. When Ge is introduced in this state, since the lattice constant of the (SiGe)C layer increases as the Ge compositional ratio increases, the lattice mismatching with the Si substrate is decreased. However, since the lattice constant is smaller than Si also in GeC to which Ge is added to the utmost degree, the (SiGe)C layer grows in a state of undergoing expansional distortion in the in-plane direction not depending on the Ge compositional ratio. It has been known that when the growing is kept in the state of undergoing the distortion, the distortion is moderated at or above a certain film thickness to generate dislocation.

When the layer containing relocation is used for the active region of the transistor, problems arise with the occurrence of leak current and the lowering of voltage withstanding. Then, examples of a method of overcoming the problems could conceivably include attaining a state of not generating relocation with the distortion kept as it is, and positively generating relocation to moderate the distortion, on which a single crystal layer with the relocation density lowered to a level of causing no practical problem is formed. In a case of growing a single crystal (SiGe)C layer on the Si substrate, when the Ge compositional ratio is small, lattice mismatching of about 20% occurs. In this case, the critical film thickness generating the dislocation is about several nm.

Figure 2:
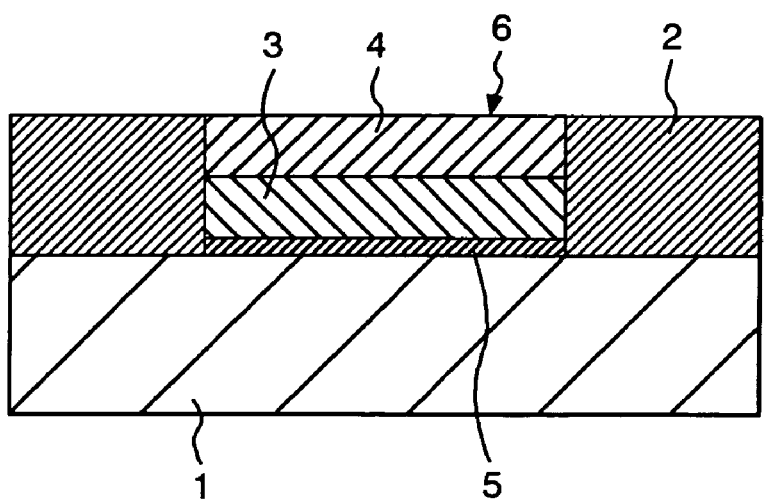
FIG. 2 is a cross-sectional view of another semiconductor device according to Embodiment 1 of the invention.

On the other hand, to positively generate dislocation to moderate distortion, a (SiGe)C buffer layer can also be used. FIG. 2 shows a cross-sectional structure in a case of using the buffer layer. When application of the buffer layer to a device is taken into consideration, since it is necessary to moderate the distortion more efficiently in a thinner buffer layer, conditions for the growing temperature, etc. are optimized, as well as C in an amount greater than the stoichiometric ratio may be introduced locally. For this purpose, it is preferred to supply an organic gas containing C to the surface of the substrate in addition to the starting gas. Examples of the organic gas include hydrocarbon gases such as methane ($CH_4$), ethane ($C_2H_6$), ethylene ($C_2H_4$), acetylene ($C_2H_2$), and propane ($C_3H_8$), and compounds of carbon and chlorine or fluorine.

Figure 4:
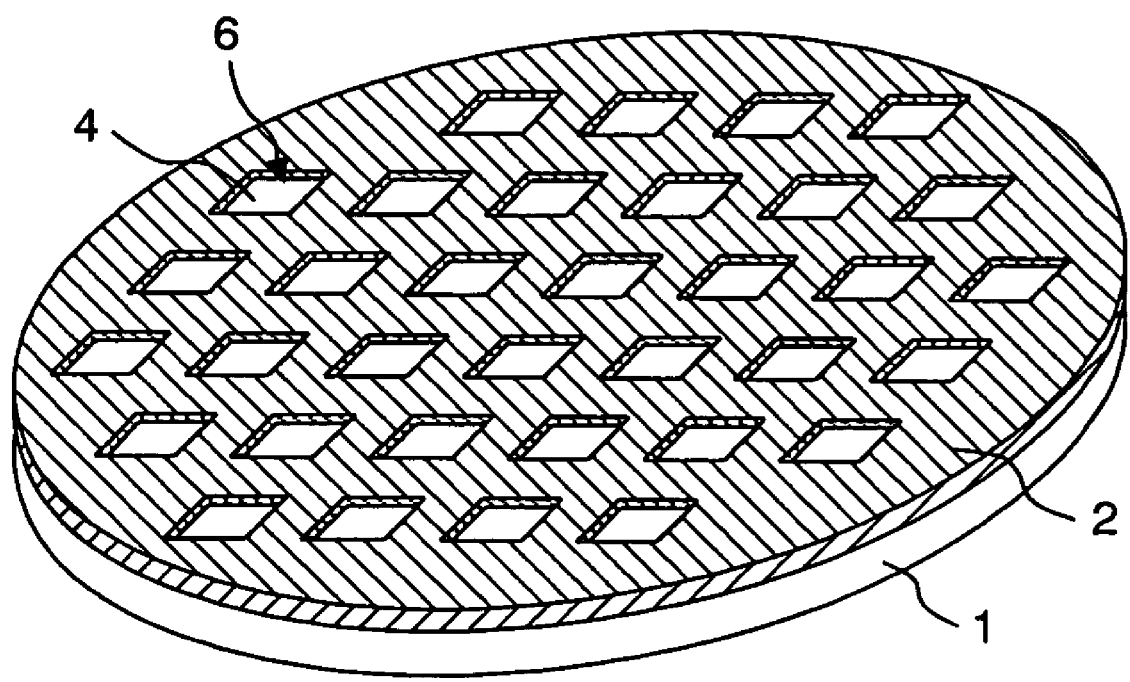
FIG. 4 is a perspective view of an entire substrate of the semiconductor device according to Embodiment 1 of the invention.

Further, local growing using selective growing is effective in efficiently moderating distortion in the buffer layer so as to improve the crystallinity of the single crystal (SiGe)C layer formed thereon. FIG. 4 shows a perspective view of an insulating film having an opening formed on an Si substrate and a single crystal (SiGe)C layer formed locally by utilizing the opening. An insulating film 2 comprising a silicon oxide film is formed on a silicon substrate 1, and openings 6 are formed by photolithography and etching. In this case, the insulating film is not always a silicon oxide film but may be a silicon nitride film or the like. Further, etching for forming the opening 6 may be wet etching or dry etching. In a case of using wet etching with a sufficiently larger selectivity between the insulating film and Si such as an aqueous solution of hydrofluoric acid, since the surface of the Si substrate 1 is not damaged, defects are less formed in the single crystal (SiGe)C layer formed thereon. Accordingly, such wet etching is suitable to a case of forming the single crystal layer without causing defects. On the other hand, in a case of using dry etching, since the surface of the Si substrate is damaged by radicals upon etching, defects are liable to occur in the single crystal layer formed thereon. In a case of dry etching, dislocations are generated by positively utilizing the nature, so that the buffer layer can be formed more efficiently. However, in this case, when the structure is applied to a semiconductor device such as a transistor, if the region containing the dislocation is used as an active region, or the pn junction is formed near the region, a care has to be taken since re-combination current is generated to worsen the characteristics. This holds true for the dislocation in the buffer layer. The size of the opening to be formed is about 500 μm or less as a size capable of effectively moderating the distortion. When the single crystal (SiGe)C layer is grown selectively under the conditions described above, since the area for the single crystal regions is small, a degree of freedom increases at the portion near the edge of the opening and the distortion can be moderated effectively.

To terminate the formation of the n-layer in the growing chamber 1 (112), supply of the growing gas and the doping gas is stopped, the gas is discharged from the reaction chamber 1 and, at the same time, the substrate temperature is lowered. In this process, it is preferred to supply a clean hydrogen gas as with the completion of the cleaning for the substrate surface in order to prevent contaminates from depositing on the substrate surface. When transferred between the growing chambers, the wafer can be transferred directly between the growing chambers. However, for epitaxial growing with a good throughput between the two growing chambers for conducting n-type and p-type doping, a substrate transfer chamber may be provided. In a case of moving the substrate from the growing chamber 1 (112) by way of the transfer chamber 111 to the growing chamber 2 (113), it is preferred to supply the hydrogen gas also to the substrate transfer chamber 111 and the growing chamber 2 (113) in order not to deposit contaminants on the surface of the Si substrate like the growing chamber 1 (112), such that the substrate is always in a state under a clean hydrogen gas. However, since the hydrogen atoms terminating the surface of the substrate can be present on the surface at the stable state if the substrate temperature is low, a recess time may be provided for the supply of the hydrogen insofar as the contaminant material does not adhere to the surface of the substrate. For example, in a case where a degree of vacuum in the growing chamber or the transfer chamber 111 is $1 \times 10^{-7}$ Pa or less, when the substrate temperature is lowered to room temperature, the contaminant material is not deposited on the surface of the substrate even when about 10 min of the recess time is provided. In a case of transferring the substrate from the growing chamber 1 (112) to the transfer chamber 111, when the pressure is greatly different between the growing chamber 1 (112) and transfer chamber 111, since the hydrogen gas flows abruptly from a high pressure side to a lower pressure side upon opening of the gate valve, it is probable that the substrate supporting position is displaced or the particles are scattered upward. Accordingly, when the substrate is transferred, it is necessary to control the respective pressures of the growing chamber 1 (112) and the transfer chamber 111 so as be substantially equal to each other. Likewise, a hydrogen gas is supplied to the growing chamber 2 (113) whose pressure has been controlled to the same pressure as that in the transfer chamber 111, and the substrate is transported from the transfer chamber 111 to the growing chamber 2 (113). Further, since the hydrogen gas containing the atomic hydrogen is supplied in the same manner as that in the cleaning for the substrate surface, and the substrate surface is easily bonded with the hydrogen atoms of increased reactivity, the hydrogen-covering ratio on the substrate surface is improved particularly in a low temperature state. As a result, since contamination less occurs on the substrate surface during the transportation and keeping of the substrate after the interruption of growing, the crystallinity of the multi-layered film can be improved. The method of supplying the hydrogen gas during transportation of the substrate with addition of atomic atom holds true for the following embodiments.

After the substrate is placed in the growing chamber 2 (113), the temperature of the substrate is elevated to an epitaxial growing temperature while the clean hydrogen is kept supplied. The conditions for supplying the hydrogen gas in this case may be made similar to the cleaning conditions for the surface of the substrate in the growing chamber 1 (112). Since the substrate is transported to the growing chamber 2 (113) while the surface of the n-single crystal (SiGe)C layer grown in the growing chamber 2 (112) is kept in a cleaned state, there no requirement for cleaning the surface of the substrate before the p-single crystal (SiGe)C layer is grown in the growing chamber 2 (113). As a result, since the treatment at higher temperature than the epitaxial growing temperature is no more necessary, deterioration of the crystallinity due to the diffusion of the dopant or occurrence of dislocations or defects in the n-single crystal (SiGe)C layer formed in the growing chamber 1 (112) and in the Si substrate. After the substrate temperature has reached the epitaxial growing temperature in the growing chamber 2 (113), the flow rate of the hydrogen gas is controlled to a level substantially equal to the total gas flow rate in the growing to be conducted subsequently and a time for stabilizing the substrate temperature is provided. Alternatively, it is also possible to control the flow rate of the hydrogen gas along with heating for the substrate like before the starting of growing in the growing chamber 1 (112) and stabilize the temperature simultaneously along with control for the substrate temperature, thereby improving the throughput.

After the substrate temperature has been stabilized, the hydrogen gas is stopped and the glowing gas and the p-doping gas are introduced to start formation of the p-single crystal (SiGe)C layer 4 as the second semiconductor layer.

As the p-doping gas, compounds comprising the group III element, and carbon, hydrogen, chlorine and fluorine can be used. Examples of the compounds include diborane ($B_2H_6$), trimethyl borone (($CH_3$)$_3$B), triethyl borone (($C_2H_5$)$_3$B), methyl borone difluoride ($CH_3BF_2$), dimethyl boron fluoride (($CH_3$)$_2$BF), boron trichloride ($BCl_3$), boron trifluoride ($BF_3$), dimethyl aluminum (($CH_3$)$_2$AlH), trimethyl aluminum (($CH_3$)$_3$Al), triethyl aluminum (($C_2H_5$)$_3$Al), methyl aluminum dichloride ($CH_3AlCl_2$), dimethyl aluminum chloride (($CH_3$)$_2$AlCl), ethyl aluminum dichloride ($C_2H_5AlCl_2$), and diethyl aluminum chloride (($C_2H_5$)$_2$AlCl).

The conditions for selective growing may be the same as that used for forming the single crystal n-(SiGe)C layer. The p-single crystal (SiGe)C layer is formed selectively by optionally using the halogen type gas simultaneously for improving the selectivity. In this case, the forbidden band width of the p-single crystal (SiGe)C layer can be changed by changing the Ge compositional ratio in comparison with the n-single crystal (SiGe)C layer, and hetero junction can be formed at the boundary between the n-single crystal (SiGe)C layer and the p-single crystal (SiGe)C layer. In this embodiment, while the description has been made of the hetero structure comprising the n-single crystal (SiGe)C layer and the p-single crystal (SiGe)C layer, this can be attained quite in the same manner also for the combination of different doping.

Further, a multi-layered structure in which a single crystal (SiGe)C layer is formed additionally to the structure described above can also be attained quite in the same manner.

As shown in this embodiment, semiconductor hetero junction of good crystallinity can be formed by using the material of (SiGe)C having larger forbidden band width and electron mobility than those of Si, so that the performance of the semiconductor device including the structure described above can be improved remarkably. By changing the conduction type and the forbidden band width of the multi-layered structure comprising the single crystal (SiGe)C using the method described in this embodiment, the semiconductor device can be applied to bipolar transistors or field effect transistors and higher operation speed and the voltage withstanding of such transistors can be improved remarkably.

Embodiment 2

FIGS. 5A to 5C shows the impurity concentration and the Ge compositional ratio profile, and the band structure of a transistor associated therewith in the intrinsic portion of a bipolar transistor as a second embodiment of a semiconductor device according to the invention. FIG. 5A shows the relationship between the depth from the surface and the impurity concentration, FIG. 5B shows the relationship between the depth from the surface and the Ge compositional ratio, and FIG. 5C shows a band structural view associated therewith. The band structural view shows the upper end a of the valence electron bond and the lower end b of the conduction band. Throughout the drawings 5A to 5C, abscissa shows the depth from the surface in a common manner.

An $n^+$-Si layer 110 as a high concentration collector region is formed on a silicon substrate, on which an n-SiC layer 111 forming a collector region is formed by epitaxial growing. In this step, as described in Embodiment 1, since a large lattice mismatching is present between the Si substrate and the SiC layer 111, it is necessary that the film thickness of SiC is reduced to a critical thickness or less, or a buffer layer is provided to positively moderate the distortion in order not to generate crystal defects. Since the critical film thickness of SiC is only about several nm, in a case of application to a bipolar transistor, the transistor can be formed more easily by providing the buffer layer. Since many dislocations are present in the buffer layer, it is desirable to form the layer at a position apart from the intrinsic region of the transistor, and with no electrical effect. Accordingly, the buffer layer is preferably formed just above the $n^+$-Si region and the electrical effect can be decreased by increasing the concentration of the n-impurity.

Then, a starting gas for Ge is added to form an $n^-$-$(Si_{1-x1}Ge_{x1})C$ 112 as a collector region. In this case, the Ge compositional ratio x1 may be a constant value but the compositional ratio may be preferably changed continuously as shown in the drawing so as to suppress occurrence of lattice distortion corresponding to the abrupt change of the compositional ratio and of the energy barrier.

Then, a p-$(Si_{1-x2}Ge_{x2})$ C layer 113 as a base layer and an $n^+$-SiC layer 114 as an emitter are epitaxially grown.

In order to improve the characteristics of the hetero junction bipolar transistor, it is necessary to decrease the forbidden band width of the base to less than that of the emitter thereby increasing the electron injection efficiency. In the example shown in FIG. 5, while the emitter is formed of SiC, and Ge is added only in the base, Ge may also be added to the emitter insofar as the forbidden band width of the emitter is larger than that of the base. Further, in a case of forming the layered structure under the conditions different from that of Embodiment 1, the forbidden band width is can be made larger in (SiGe)C compared with SiC. In this case, to make the forbidden band width of the emitter larger than that of the base, more Ge has only to be added to the emitter. The impurity concentration and the Ge compositional ratio profile of the bipolar transistor described in this embodiment are applicable also to other embodiments.

Figure 6:
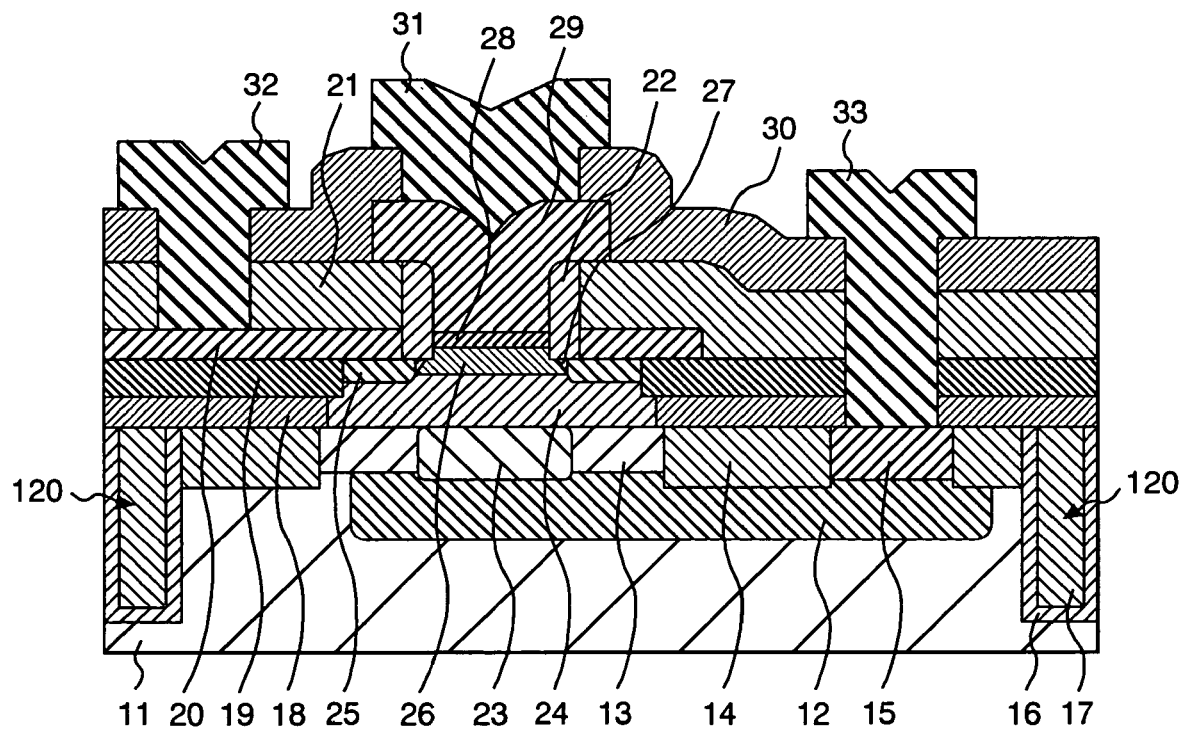
FIG. 6 is a schematic cross-sectional view of a main portion of a bipolar transistor according to Embodiment 2 of the invention.

FIG. 6 shows a cross-sectional structure of a bipolar transistor showing an embodiment of a semiconductor device according to the invention. A high concentration n-Si layer 12 and a low concentration n-Si layer 13 as a collector are formed on an Si substrate 11. A collector-base insulating film 14 is formed in the portion other than the active region of the transistor and a collector extension region 15 is formed at the collector region. A trench 120 is formed by dry etching between the transistors. After an insulating film 16 is formed on the inner wall of the trench 120, an insulating film 17 is further buried in the trench 120 to form a device isolation region.

A polycrystal Si layer 20 as a base extension electrode and an emitter-base isolation insulating film 21 are formed on collector-base isolation insulating films 18 and 19, and an opening is formed in the emitter-base isolation insulating film 21 and the base extension electrode 20. After a second emitter-base isolation region 22 is formed on the sidewall of the base extension electrode 20 in the opening, a high concentration collector region 23 is formed. An opening is formed in the collector-base isolation insulating films 19 and 18 to expose the low concentration n-Si layer 23. Then, an n-SiC layer 24 as a low concentration collector, a p-(SiGe)C layer 26 as an intrinsic base and connection bases 25 and 27 are formed only above the low concentration n-SiC layer 23. After the intrinsic base layer 26 is formed such that its surface is above the bottom of the second emitter-base isolation region 22, an n-SiC layer 28 as an emitter layer is epitaxially grown successively. After a high concentration n-polycrystal Si layer 29 is formed as an emitter electrode, an insulating film 30 is formed entirely. Finally, an emitter electrode 31, a base electrode 32, and a collector electrode 33 are formed.

Figure 7A:
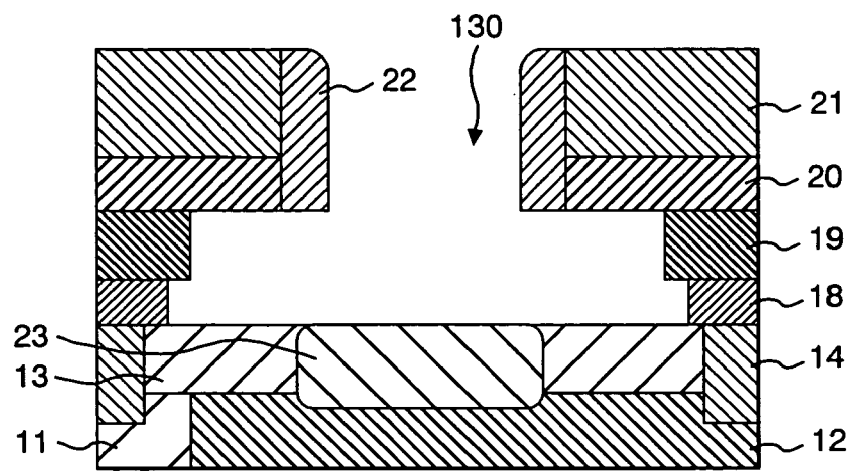
FIGS. 7A, 7B and 7C are partially enlarged cross-sectional views showing the manufacturing method for an active region of a semiconductor device according to the invention shown in FIG. 6, in the order of steps.
Figure 7B:
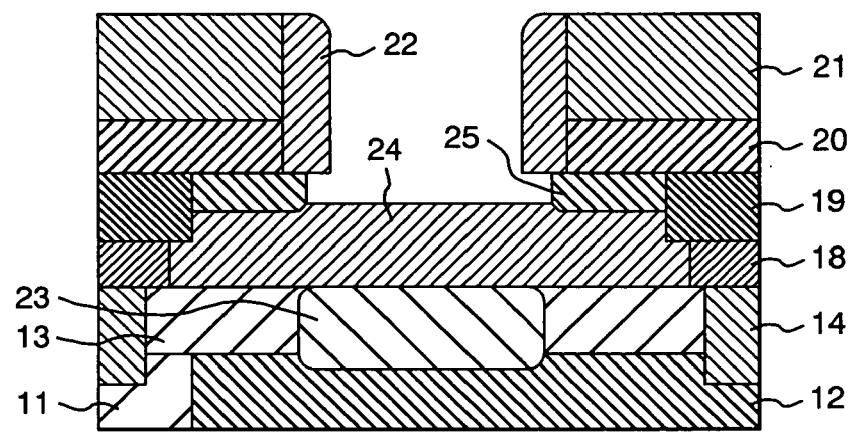

FIGS. 7A to 7C and FIGS. 8A and 8B show flow charts for the method of manufacturing the low concentration collector layer, the intrinsic base layer and the emitter layer for obtaining the semiconductor device having the structure shown in FIG. 6. At first, a high concentration n-single crystal Si layer 12 as a collector layer is formed, and a device isolation insulating film 14 and a low concentration n-single crystal Si layer 13 as a low concentration collector layer in the opening thereof are formed. An Si oxide film 18 as a collector-base isolation insulating film and an Si nitride film 19 as the collector-base isolation insulating film are deposited, on which the p-polycrystal Si layer 20 as a base extension electrode and an emitter-base isolation insulating film 21 are formed. An opening 130 is formed in the p-polycrystal Si layer 120 and the emitter-base isolation insulating film 21. The opening 130 is a means for forming a local semiconductor single crystal layer in the invention. An emitter-base isolation insulating film 22 is formed on the sidewall of the opening 130 and ions are implanted into the opening 130, to form an n-collector region 23. Then, the collect-base isolation insulating films 19 and 18 are etched successively to expose the surface of the low concentration n-single crystal Si layer 13 and the n-collector region 23 (FIG. 7A).

In the opening 130, an n-collector layer 24 comprising the n-single crystal (SiGe)C and the following semiconductor single crystal layer are formed by selective epitaxial growing by the method shown in Embodiment 1. That is, predetermined first and second semiconductor single crystal layers are formed locally on the semiconductor substrate. The general range for the composition of the material is as has been described above.

Figure 5:
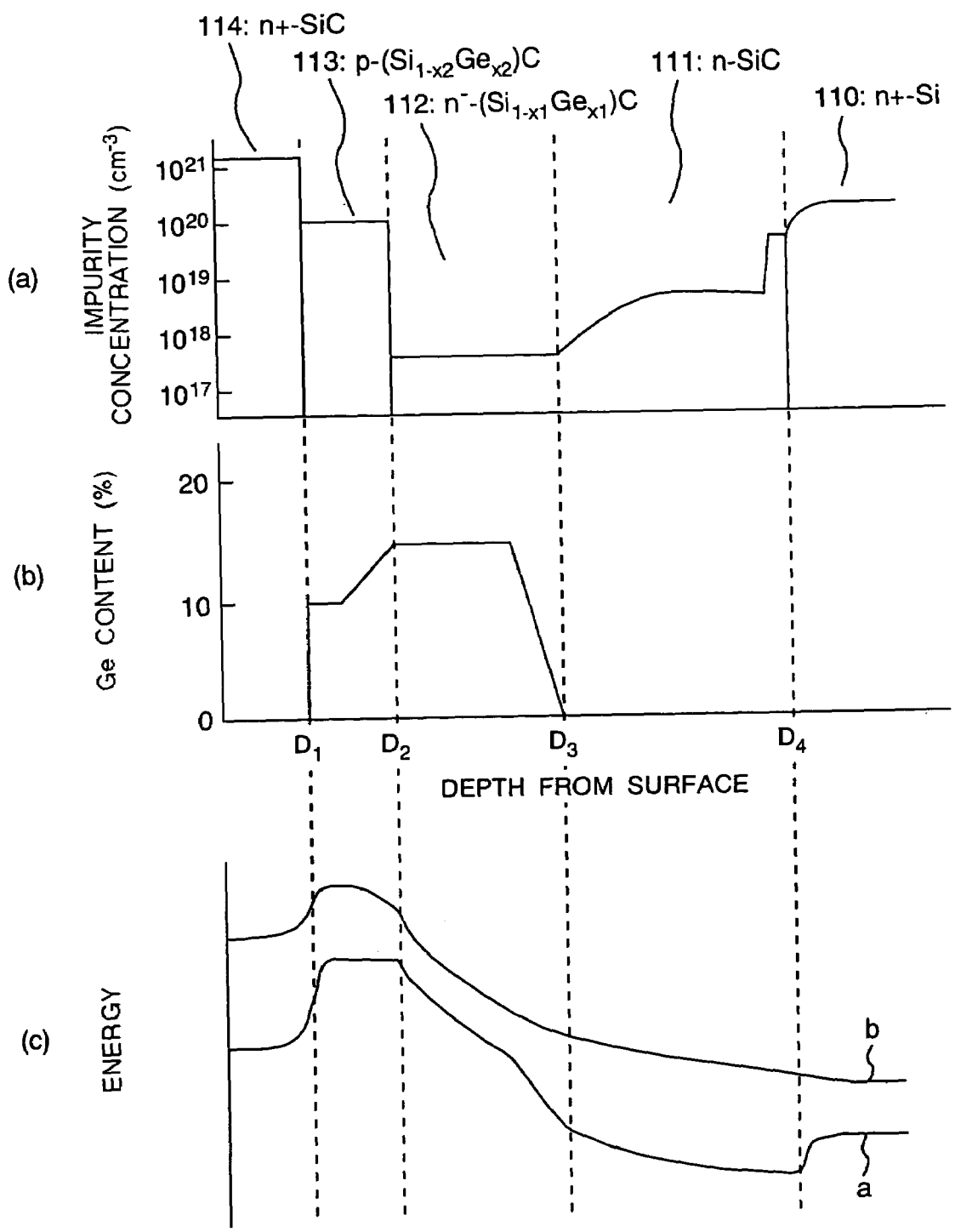
FIG. 5A is a characteristic graph showing the impurity concentration of a bipolar transistor in terms of the depth from its surface, according to Embodiment 2 of the invention.
FIG. 5B is a characteristic graph showing distribution of the Ge compositional ratio of a bipolar transistor in terms of the depth from its surface, according to Embodiment 2 of the invention.
FIG. 5C is a band structural view of a bipolar transistor in terms of the depth from its surface according to Embodiment 2 of the invention.

When the Ge compositional ratio in the n-collector layer 24 is changed as the Ge compositional ratio profile shown in FIG. 5, it is possible to decrease the lattice distortion and suppress the occurrence of the energy barrier in the collector. At the same time with the formation of the n-single crystal (SiGe)C layer 24 on the surface of the low concentration n-single crystal Si layer 13, an n-polycrystal (SiGe)C layer 25 is grown from the bottom of the p-polycrystal Si layer 20 of a peaked structure. In this step, while the crystal structure of the p-polycrystal Si layer 20 changes depending on the growing condition, the (111) face and the (311) face are predominant for the plane direction. When the (100) face is used for the Si substrate, since the growing speed is lower on the (111) face or (311) face compared with the (100) face, the thickness of the n-polycrystal (SiGe)C layer 25 is smaller than the n-single crystal (SiGe)C layer 24. When the intrinsic base is formed continuously in this state, since the n-polycrystal (SiGe)C layer 25 is present between the intrinsic base and the p-polycrystal Si layer 20 as the base extension electrode, this may possibly increase the base resistance or hinder electric conduction. Accordingly, after the n-single crystal (SiGe)C layer 24 and the n-polycrystal (SiGe)C layer 25 are formed, annealing is conducted in the growing chamber to diffuse p-impurities from the p-polycrystal Si layer 20 to convert a portion of the n-crystal (SiGe)C layer 25 into the p-type (FIG. 7(B)).

Figure 7C:
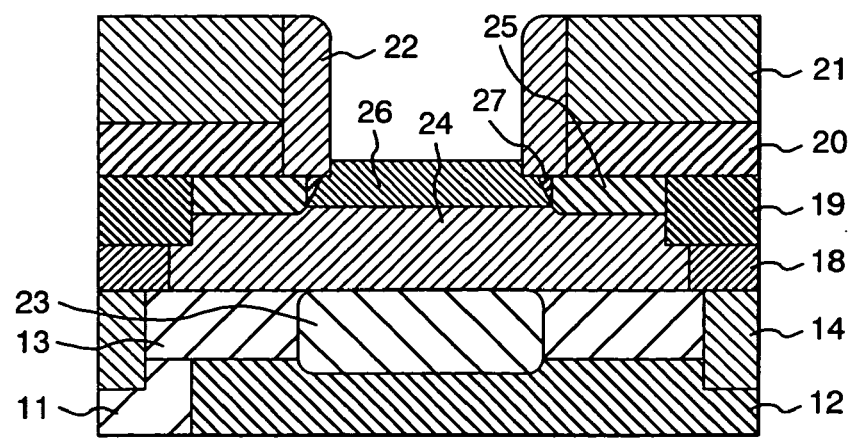

Then, a p-single crystal (SiGe)C layer 26 as an intrinsic base is formed by selective epitaxial growing on the n-single crystal (SiGe)C layer 24 and, at the same time, a p-polycrystal (SiGe)C layer 27 is formed on the n-polycrystal (SiGe)C layer 25. To prevent contact between the emitter and the p-polycrystal (SiGe)C layer 27 when the emitter is formed, the surface of the p-polycrystal (SiGe)C layer 26 is preferably above the bottom of the emitter-base isolation insulating film 22 (FIG. 7C).

Figure 8A:
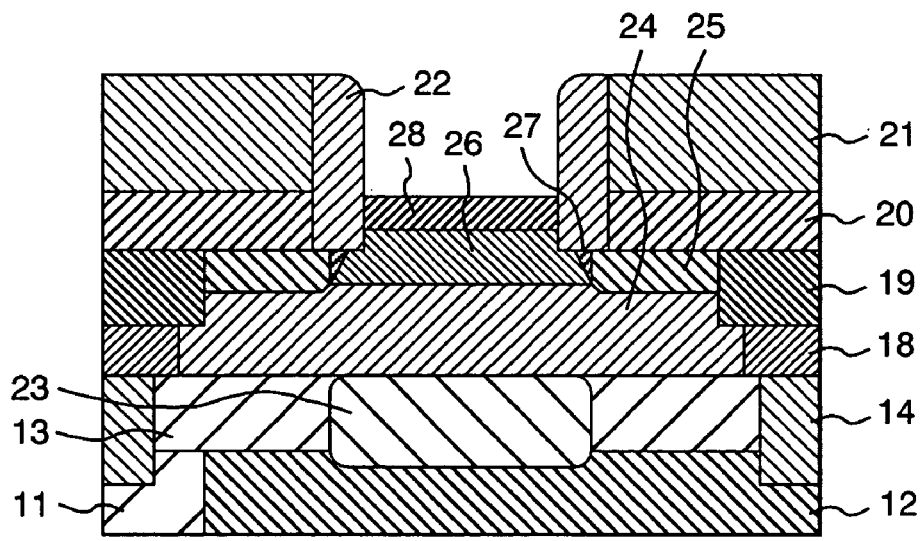
FIGS. 8A and 8B are partially enlarged cross-sectional views showing the steps next to FIG. 7 in the order of steps.
Figure 8B:
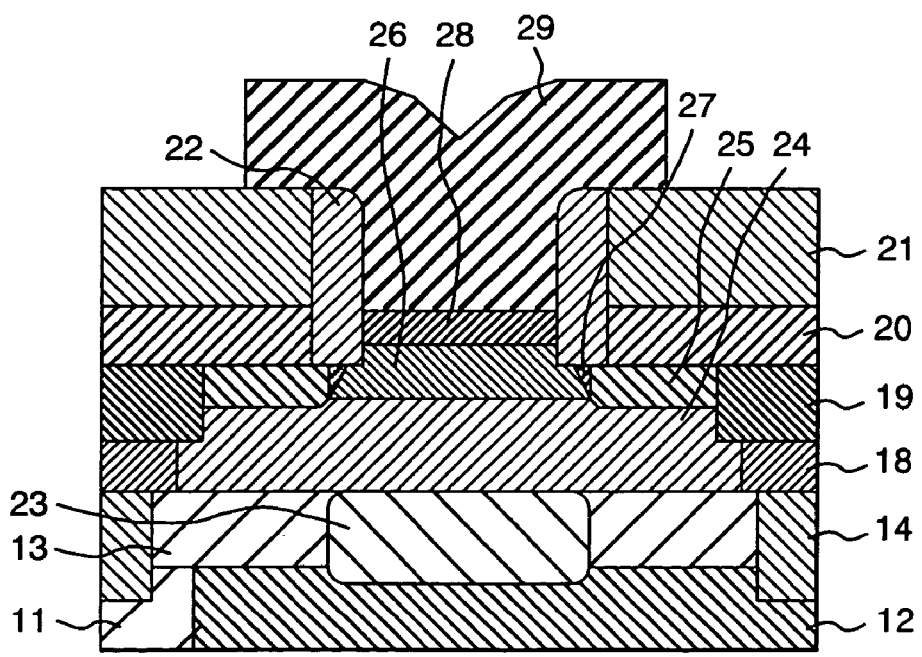

However, in a case where the surface of the p-single crystal (SiGe)C layer 26 is below the bottom of the emitter-base isolation insulating film 22, an insulating film may be further formed on the sidewall of the emitter-base isolation insulating film 22 to cover the p-polycrystal (SiGe)C layer. Then, an n-single crystal SiC layer 28 as an emitter is formed by the selective growing in the same manner as for the collector (FIG. 8A). Finally, when a high concentration n-polycrystal Si layer 29 as an emitter electrode is formed in the opening, the intrinsic portion of the bipolar transistor shown in FIG. 6 is completed (FIG. 8B).

According to this structure, since a bipolar transistor can be formed by the (SiGe)C layer having a large forbidden band width and good crystallinity, this is effective in increasing the operation speed and improving the performance of the bipolar transistor. Accordingly, the transistor can provide cut off frequency higher than 300 GHz. Further, the method of this example provides a self-alignment structure in which the mask alignment is not adopted at all when the collector-base-emitter intrinsic region is formed. Accordingly, the parasitic capacitance and the base resistance can be decreased greatly, the highest generation frequency of the bipolar transistor can be improved remarkably, and the noise of the transistor can be decreased.

Further, since the bipolar transistor using (SiGe)C can be formed on the substrate on which usual semiconductor devices comprising Si or SeGe are formed, it is also possible to lower the cost and power consumption of LSI.

Embodiment 3

Figure 9:
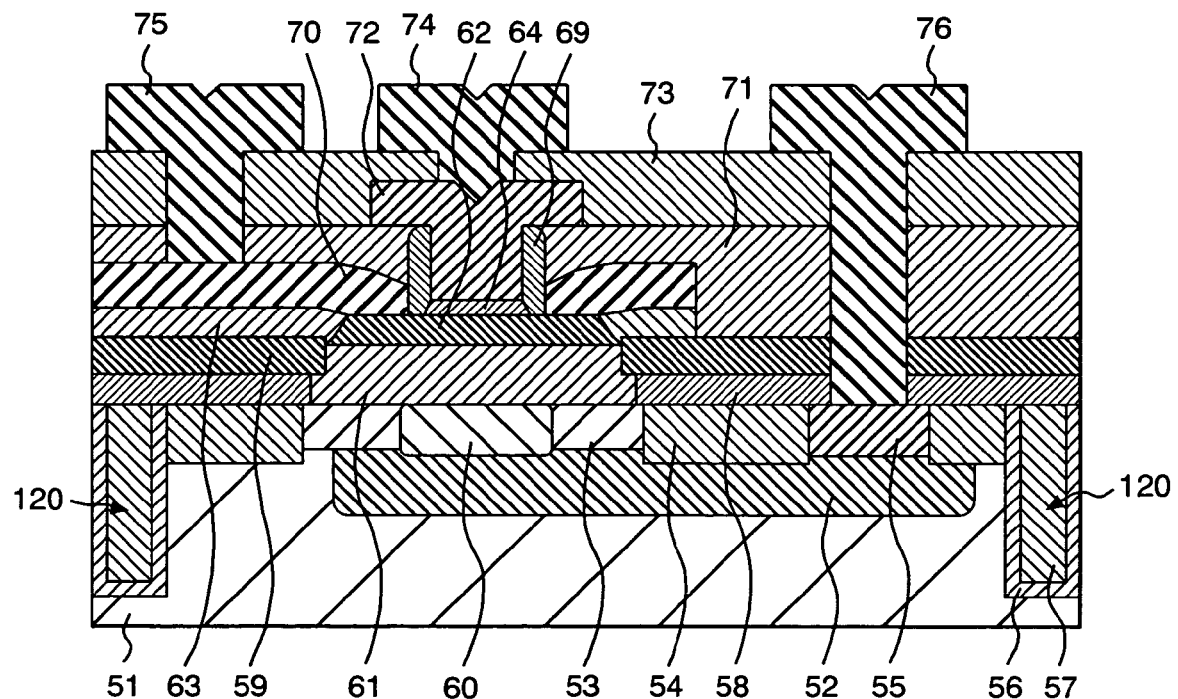
FIG. 9 is a schematic cross-sectional view of a main portion of a bipolar transistor according to Embodiment 2 of the invention.

FIG. 9 shows a cross-sectional structure of a bipolar transistor showing a third embodiment of a semiconductor device according to the invention. This embodiment is characterized by the intrinsic base and an extension structure therefrom.

A high concentration n-Si layer 52 and a low concentration n-Si layer 53 as a collector are formed on an Si substrate 51. A collector-base insulative layer 54 is formed at the portion other than the active region of the transistor, and a collector extension region 55 is formed in the collector region. A trench 120 is formed by dry etching between the transistors and an insulating film 56 is formed on the inner wall of the trench 120. Then, an insulating film 57 is further buried in the trench 120 to form a device isolation region.

Collector-base isolation insulating films 58 and 59 are formed and a high concentration collector region 60 is formed. An opening 130 is formed in the collector-base isolation insulating films 59 and 58 to expose the low concentration n-Si layer 53. The opening 130 is a means for forming the local semiconductor single crystal layer in the invention. Then, an n-SiC 61 as a low concentration collector is formed only on the low concentration n-Si layer 53. Further, a p-single crystal (SiGe)C layer 62 as an intrinsic base and a p-polycrystal (SiGe)C layer 63 as an external base are formed on the n-SiC layer 61 and the collector-base isolation insulating film 59 respectively. Then, an n-single crystal SiC layer 64 as an emitter layer is formed on the p-single crystal (SiGe)C layer 62, and a p-polycrystal Si layer 68 as a base extension electrode and a high concentration n-polycrystal Si layer 70 as an emitter electrode are formed. Subsequently, an insulating film 69 is deposited entirely. Finally, an emitter electrode 72, a base electrode 73, and a collector 74 are formed.

FIGS. 10A to 10C, and FIGS. 11A to 11C show flowcharts for the method of manufacturing a low concentration collector layer, an intrinsic base layer and an emitter layer for attaining the semiconductor device having the structure shown in FIG. 9.

Figure 10A:
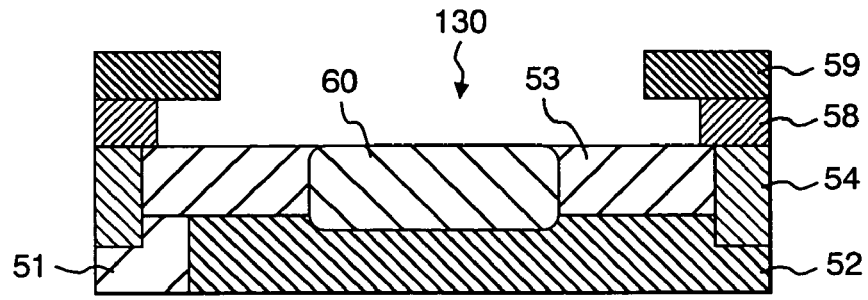
FIGS. 10A, 10B and 10C are partially enlarged cross-sectional views showing the manufacturing method for an active region of a semiconductor device according to the invention shown in FIG. 9, in the order of steps.

At first, a high concentration n-single crystal Si layer 52 as a collector layer is formed, a device isolation insulating film 54 is formed, and a low concentration n-single crystal Si layer 53 as a low concentration collector layer is formed in the opening 130 thereof. An Si oxide film 58 and an Si nitride film 59 as a collector-base isolation insulating film are deposited, and ions are implanted in the low concentration n-single crystal Si layer 53 to form an n-collector region 60. Then, the collector-base isolation insulating films 59 and 58 are etched successively to expose the surface of the low concentration n-single crystal Si layer 53 (FIG. 10A).

Figure 10B:
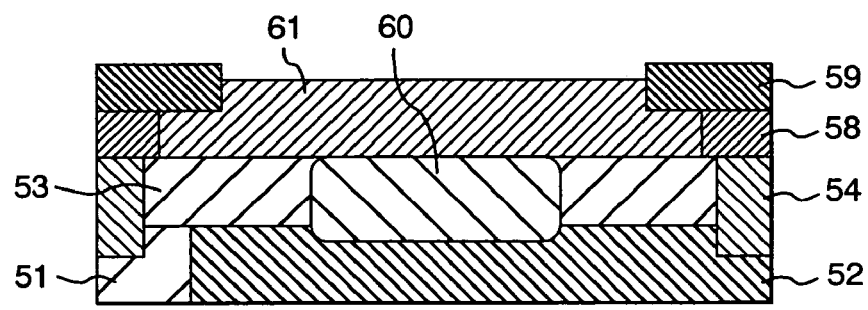

In the opening 130, an n-collector layer 61 comprising n-single crystal (SiGe)C is formed by selective epitaxial growing by the method shown in Embodiment 1 (FIG. 10B). That is, predetermined first and second semiconductor single crystal layers are formed locally on the semiconductor substrate. The general range for the composition of the material is as has been described above. For example, if the Ge compositional ratio is changed in the n-collector layer 61 as in the Ge compositional ratio profile shown in FIG. 5, it is possible to decrease the lattice distortion and suppress the occurrence of energy barrier in the collector.

Figure 10C:
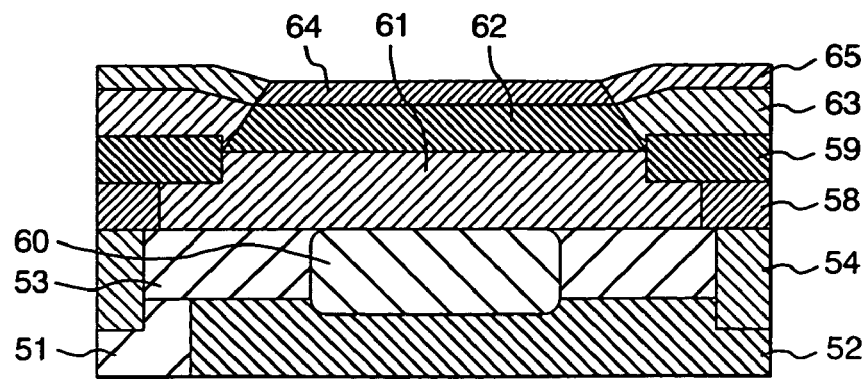
Figure 11A:
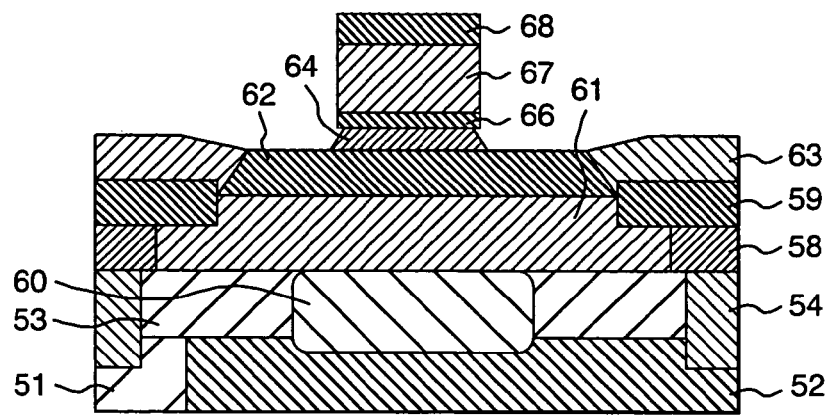
FIGS. 11A, 11B and 11C are partially enlarged cross-sectional views showing the steps next to FIG. 10 in order of steps.

Then, a p-single crystal (SiGe)C layer 62 as an intrinsic base and a p-polycrystal (SiGe)C layer 63 as an external base are formed on the n-single crystal (SiGe)C layer 61 and on the collector-base isolation insulating film 59, respectively. In the same manner, an n-single crystal SiC layer 64 and an n-polycrystal SiC layer 65 as an emitter are formed on the p-single crystal (SiGe)C layer 62 and the p-polycrystal (SiGe)C layer 63, respectively (FIG. 10C). Then, an insulating film 66, a polycrystal Si layer 67, and an insulating film 68 are deposited for the entire surface, and the insulating film 68, the polycrystal Si layer 67, and the insulating film 66 in the regions other than the intrinsic region are removed by photolithography and anisotropic etching. Then, a portion of the n-polycrystal SiC layer 65 and the n-single crystal SiC layer 64 is etched to remove by etching having selectivity depending on the difference of the conductivity. For example, etching using hydrazine can be used for the method. Etching by hydrazine has a lower etching speed for the p-type layer than that for the n-type layer. Then, when the amount of etching for the p-type layer is estimated taking the amount of over etching into consideration for allowing scattering in the process and the thickness of the p-type layer is set at a level larger than a thickness corresponding to the estimated amount, the p-type layer is not etched completely (FIG. 11A).

Figure 11B:
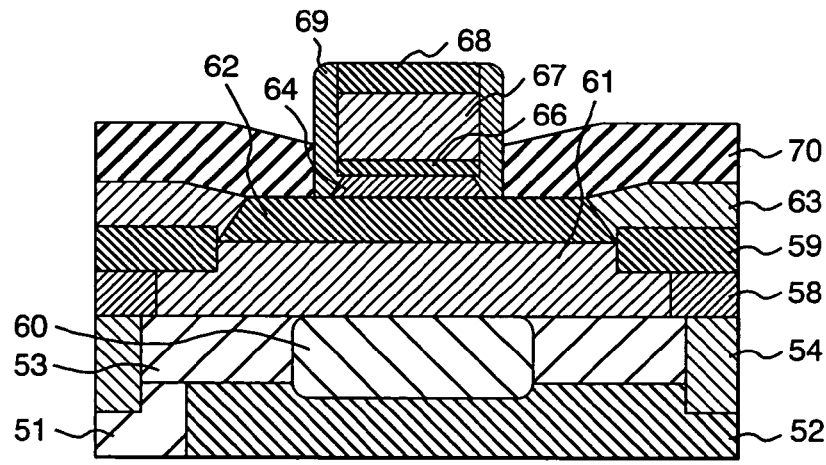

An insulating film 69 is formed on the sidewalls of the insulating film 68, the polycrystalline Si layer 67 and the insulating film 66, and the n-single crystal SiC layer 64 and a p-polycrystal Si layer 70 as a base extension electrode are deposited on the single crystal (SiGe)C layer 62 and the polycrystal (SiGe)C layer 63. In this step, the p-polycrystal Si layer 70 may be formed on the p-single crystal (SiGe)C layer 62 and the p-polycrystal (SiGe)C layer by selective growing (FIG. 11B).

Figure 11C:
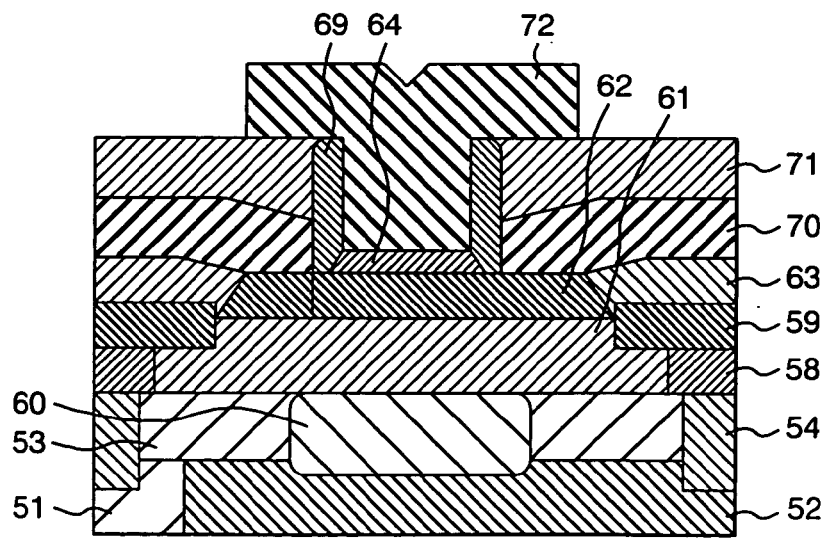

Finally, an interlayer insulating film 71 is formed over the entire surface, the surface of the polycrystal Si layer 66 is exposed by chemical mechanical polishing, the polycrystal Si layer 67 and the insulating film 66 are etched, and a high concentration n-polycrystal layer 72 as an emitter electrode is formed in the opening. Thus, the intrinsic portion of the bipolar transistor shown in FIG. 9 is completed (FIG. 11C).

According to this structure, since a bipolar transistor can be formed by the (SiGe)C layer having a large forbidden band width and good crystallinity for the intrinsic base 62, this is effective in increasing the operation speed and improving the performance of the bipolar transistor. Further, since the base extension electrode is formed after the epitaxial growing, it can be reliably connected with the intrinsic base even upon occurrence of scattering in the thickness of the insulating film and scattering in the process in the epitaxial growing. In addition, it is possible to lower the base resistance and decrease the scattering thereof. Accordingly, a cut off frequency higher than 300 GHz can be attained in this transistor. Further, since this transistor has the self-alignment structure in which a mask is not adopted when the collector-base-emitter intrinsic region is formed, the parasitic capacitance and the base resistance can be lowered remarkably, the highest generation frequency of the bipolar transistor can be improved remarkably, and the noise of the transistor can be reduced. Further, since the bipolar transistor using (SiGe)C can be formed on the substrate on which usual semiconductor devices comprising Si or SeGe are formed, it is also possible to lower the cost and power consumption of LSI.

Embodiment 4

Embodiment 4 exemplifies a field effect semiconductor device using a (SiGe)C layer as a channel layer and an SiC layer as a barrier layer. In the field effect semiconductor device, a channel layer through which electrons flow is formed in the SiC layer or the (SiGe)C layer. SiC is the so-called silicon carbide (hereinafter simply referred to as Si carbide) having a stoichiometric ratio of Si to C being about 1:1 and having a blende type crystal structure. The stoichiometric ratio is sometimes deviated slightly from 1:1 depending on crystal defects (lamination defects, inter-lattice atom, etc.) or impurities to some extent. Further, (SiGe)C is a material having the ratio of the sum of the numbers of atoms of Si and Ge to the number of atoms of C being about 1:1 and having a blende crystal structure.

Figure 12:
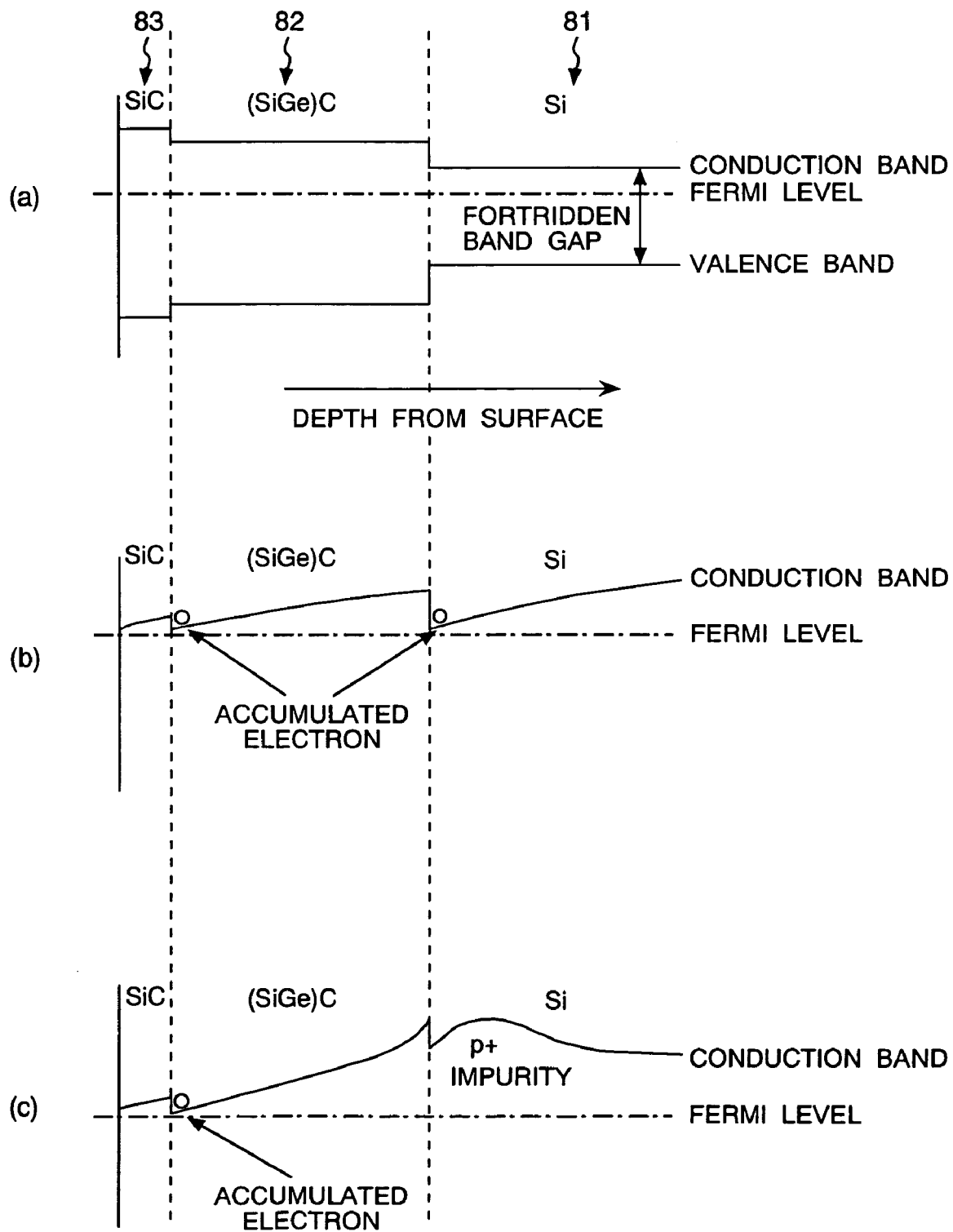
FIG. 12A is a schematic diagram showing a band structure in which an SiC layer, an (SiGe)C layer, and Si layer are stacked.
FIG. 12B is a schematic diagram showing a case where a voltage is applied to the gate electrode.
FIG. 12C is a schematic diagram showing a case where p+ impurities are added and a voltage is applied to the gate electrode.

The magnitude relation of the forbidden band width between SiC and (SiGe)C is different depending on the Ge content or the method of film formation. In the field effect semiconductor device of the invention, the channel layer is formed of the material having the smaller forbidden band and the barrier layer is formed of the material having the larger forbidden band width. FIG. 12A shows a band structural diagram in a case where the SiC layer has the larger forbidden band. The basic cross-sectional structure of the field effect semiconductor device in this embodiment is as shown schematically in FIG. 1. The single crystal (SiGe)C layer 3 and the single crystal (SiGe)C layer 4 as the barrier layer are formed above the Si substrate 1. In this case, each of the semiconductor layers is formed in an opening 6 formed in the insulating film 2. Further, a gate electrode, and a source electrode and a drain electrode on both sides thereof are formed above the barrier layer 4 like in usual field effect semiconductor devices. The gate electrode can induce electrons by the field effect in the inside of the channel layer, allowing electric current to flow from the source electrode to the drain electrode formed on both sides.

Figure 13:
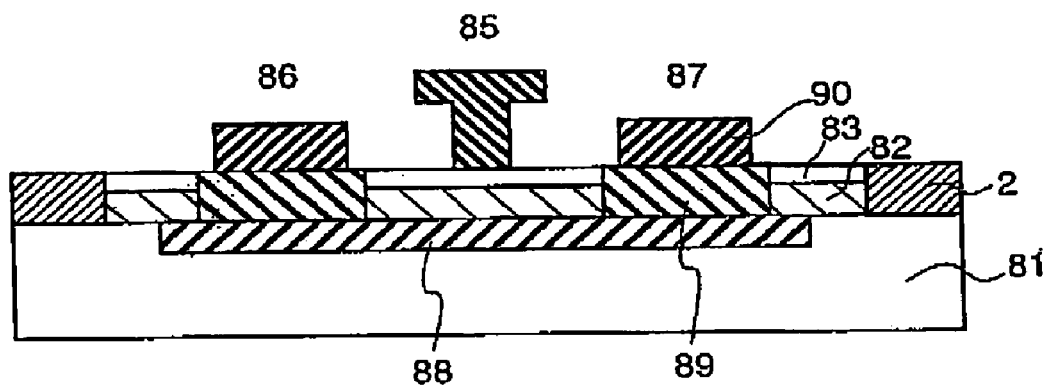
FIG. 13 is a cross-sectional view of a main portion of a field effect semiconductor device according to the means for solving the problem of the invention and Embodiment 4 of the invention.

FIG. 12A is a schematic diagram of the band structure in which an SiC layer 83, an (SiGe)C layer 82, and an Si layer 81 are layered according to Embodiment 4. FIG. 12B is a schematic diagram of the band structure in which a voltage is applied to the gate electrode above the barrier layer to turn the semiconductor device into an ON state. FIG. 12C is a schematic diagram showing the case of adding a high concentration p-type impurity to the inside of the Si layer near the boundary between the (SiGe)C layer and the Si layer, and the band structure in a case where the gate voltage is applied in the same manner as in FIG. 12B. In all the figures, the layering direction is the axial direction. FIG. 12A shows the lower end of the conduction band and the upper end of the balance electron band, and FIGS. 12B and 12C show the lower end of the conduction band. FIG. 13 shows a main cross-sectional view of a field effect semiconductor device of this embodiment. FIG. 13 is an example of a field effect semiconductor device using various semiconductor layers of the invention, in which only the regions of the main semiconductor layers are shown while regions of insulator layers for forming the semiconductor layers are not illustrated.

At first, the operation principle of this semiconductor device is to be described with reference to FIGS. 12A to 12C. As shown in FIG. 12A, the forbidden band width is larger in the order of SiC (83), (SiGe)C (82), and Si (81). However, in a case of forming the layered structure under the conditions different from this embodiment, the forbidden band width for (SiGe)C is sometimes larger than that for SiC.

In a case of forming a gate electrode 85 on the surface of an SiC barrier layer 83 and applying a voltage to the gate electrode, the band is flexed as shown in FIG. 12B, and electrons are accumulated in the (SiGe)C layer 82 near SiC 83 and (SiGe)C 82 to form a channel. However, since the forbidden band width of Si is smaller, electrons are accumulated also in the Si layer near Si 81 and (SiGe)C 82. The electrons are indicated as "accumulated electrons" in FIG. 12B. Since the saturation speed of electrons accumulated in the Si layer 81 is about one-half the electron accumulated in the (SiGe)C layer 82, this causes lowering of the operation speed.

Further, to increase the operation speed, it is necessary to shorten the electron running time in the channel, that is, to reduce the gate length. However, since it is difficult to control electrons accumulated in the Si layer 81 by the electric field from the gate, this increases leak current passing from the source to the drain, that is, increases the punch-through current, and thus, transistor no more operates normally.

Accordingly, high concentration p-impurity is added only to the Si layer 81. It is indicated as "$p^+$-impurity" in FIG. 12C. Then, as shown in FIG. 12C, the energy level in the Si layer changes and the band is flexed greatly at the boundary between the (SiGe)C layer 82 and the Si layer 81. Therefore, electrons are no longer accumulated in the Si layer. Accordingly, lowering of the operation speed and the increase of the punch through current are prevented. Further, since an additional channel is formed to the gate electrode on the side of the boundary to deteriorate the performance if the SiC barrier layer 3 on the side of the surface is excessively thick, it is desirable that the barrier layer 83 is as thin as possible.

Then, the structure of the field effect semiconductor device of this embodiment is to be described with reference to FIG. 13. An (SiGe)C channel layer 82 and an SiC barrier 83 are formed in this order on a high concentration p-region 88 disposed on an Si layer 81. A gate electrode 85 is formed at a central portion on the barrier layer 83, and a source electrode 86 and a drain electrode 87 are formed on both sides of the gate electrode 85 so as to sandwich the same. The Si:Ge ratio of the (SiGe)C layer 82 is 95:5 and the film thickness is 70 nm. The thickness of the SiC layer 83 is 5 nm. The gate electrode 85 forms a T-shaped Ni/Ti Schottky gate. Boron is ion implanted into the Si layer 81 below the channel layer 82 to form a high concentration p-region 88. Arsenic ions are implanted to the SiC layer 83 and the (SiGe)C layer 82 of regions 86 and 87 which form source and drain, to form a high concentration n-region 89. An n-electrode 90 for ohmic contact is formed on the n-region.

A method of manufacturing the semiconductor device is to be described below. Since the method of forming the SiC layer or (SiGe)C layer locally on the Si substrate is described separately, this is omitted in this chapter. The SiC layer 83 and the (SiGe) C layer 82 are previously doped to an extremely weak p-type such that the threshold voltage of the transistor is about at +0.7 V.

The active region of the device in the layered structure of the (SiGe)C layer 82 and the SiC layer 83 on the Si layer 81 manufactured in accordance with the method described above is separated by dry etching. Further, an Si oxide film is buried in a region in which the underlying Si is exposed by etching and then planarized by polishing.

Then, boron is implanted at $5 \times 10^{13}$ cm$^{-2}$ directed to the vicinity of the boundary between the upper portion of the Si layer 81 and the (SiGe)C layer 82 of the active region, and nitrogen or boron is implanted in a range of about $2 \times 10^{12}$ cm$^{-2}$ or less directed to the inside of the SiC value layer 83 for the control of the threshold value. Nitrogen is implanted in a case of intending to lower the threshold voltage or boron may be implanted in a case of intending to increase the threshold voltage. When they are partially implanted using a mask, the threshold voltage can be lowered only for the portion. Further, source and drain regions 86 and 87 are formed by arsenic ion implantation. The As implantation amount is defined as about $4 \times 10^{15}$ cm$^{-2}$. Impurities implanted so far are activated by the instantaneous high temperature heat treatment at 1100° C.

Then, after the surface of the SiC barrier layer 83 is cleaned by chemical cleaning, an Ni Schottky gate electrode film is vapor deposited and fabricated into a gate length of 0.15 μm by dry etching. Further, titanium as an upper film of the T-shaped gate electrode is vapor deposited and fabricated by dry etching. Finally, ohmic metal (Al) is vapor deposited above the source and drain regions and fabricated by dry etching to complete a main portion of the semiconductor device. Since wiring steps and the like are the same as those for general semiconductor devices, they are omitted.

In the case described above, although accumulation of electrons to the channel layer is enabled by utilizing the difference of the forbidden band width between SiC and (SiGe)C, the phenomenon can also occur in other combinations than that of the two kinds of materials described above. For example, it is also possible by the combination of SiC or (SiGe)C and a nitride semiconductor such as BeSiN$_2$, ZnSiN$_2$, or ZnGeN$_2$. In this case, since any of the materials has a larger forbidden band width compared with SiC or (SiGe)C, SiC or (SiGe)C is used for the channel layer and the nitride semiconductor is used for the barrier layer.

Doping of p-impurity doping at high concentration is difficult for SiC or (SiGe)C. Therefore, in a case of constituting the field effect semiconductor device only with the material described above, it is difficult to constitute an enhancement type field effect semiconductor device. Further, when the gate length is reduced for conducting a higher speed operation, since the concentration of the channel impurity is low, punch through current between the source and drain increases easily because of low concentration of the channel impurity, making the transistor operation difficult.

The invention adopts a configuration of forming an SiC or (SiGe)C layer on the Si layer. With such a configuration, since it is easy to form high concentration p-type in the Si layer near the portion in contact with SiC or (SiGe)C layer and the SiC or (SiGe)C layer less forms the p-type, an abrupt pn junction can be formed near the boundary between the SiC or (SiGe)C layer and the Si layer. With the configuration described above, enhancement type operation is enabled by the p-type impurity at high concentration in the Si layer and the effect of suppressing punch through current in the shortened channel structure is also increased.

The Si layer may be a portion on the surface side of the so-called Si substrate or it may be an epitaxial Si substrate in which the Si layer is epitaxially grown only on the side of the surface to further reduce the defect density. Further, it may be an SOI (Silicon On Insulator) substrate in which a thin Si layer is formed on an insulative layer, or a substrate with a porous Si layer in which a porous Si layer is formed on the surface. In the case of the latter SOI or porous Si substrate, crystal lattice mismatching caused when the SiC or (SiGe)C layer is formed can be moderated efficiently by utilizing the viscoelasticity of the underlying SOI layer or porous Si layer, so that crystal quality of the SiC layer or the (SiGe)C layer can be improved.

The gate layer is formed on the barrier layer of SiC or (SiGe)C at the surface but it may be an MES type of using a Schottky metal, or an MIS type of forming a gate electrode by way of a insulating film. In the latter case, any of metals, metal silicides or polycrystal Si can be used as the material for the gate electrode.

Resistance of the source and drain electrodes can also be lowered by adding an n-type impurity at high concentration to one or both of the SiC and (SiGe)C layers. The SiC or (SiGe)C layer can be partially or entirely reacted with a metal to form metal silicide. Alternatively, a metal silicide electrode can be brought into contact with the high concentration impurity layer of the former thereby ensuring electric connection.

The SiC and (SiGe)C layers described so far are formed locally on the Si substrate. Accordingly, it is possible to form the large forbidden band width semiconductor device in the region formed with the layers described above while form an existent Si semiconductor integrated circuit in a region not formed with the layers. In this way, an integrated circuit chip in which a large forbidden band semiconductor device and an Si semiconductor device are hybridized in one chip (monolithic) can be manufactured. The manufacturing processes for both of them can be advanced in parallel by mask separation. That is, degradation of the performance of the semiconductor device due to heat treatment can be minimized by application of the process with a larger thermal load at first and application of the process with a smaller thermal load subsequently.

Irrespective of descriptions in the preceding paragraph, it is sometimes desirable of not conducting one chip hybridization, taking into consideration the effect of heat generation from a portion of the chip on other portions, for example. Also in such a case, a large forbidden band width semiconductor chip, an Si semiconductor chip, or a hybridized chip for both of them may be incorporated in one module to satisfy the functions thereof.

The features of the field effect semiconductor device according to the invention as described above are the same as in other embodiments concerning the field effect semiconductor devices.

Embodiment 5

This embodiment shows a field effect semiconductor device formed on an SOI substrate. Since the manufacturing steps are substantially the same as those in Embodiment 4, only the difference therebetween is described. The SOI substrate means an Si substrate in which an $SiO_2$ insulative layer is formed below an Si active layer.

Figure 14:
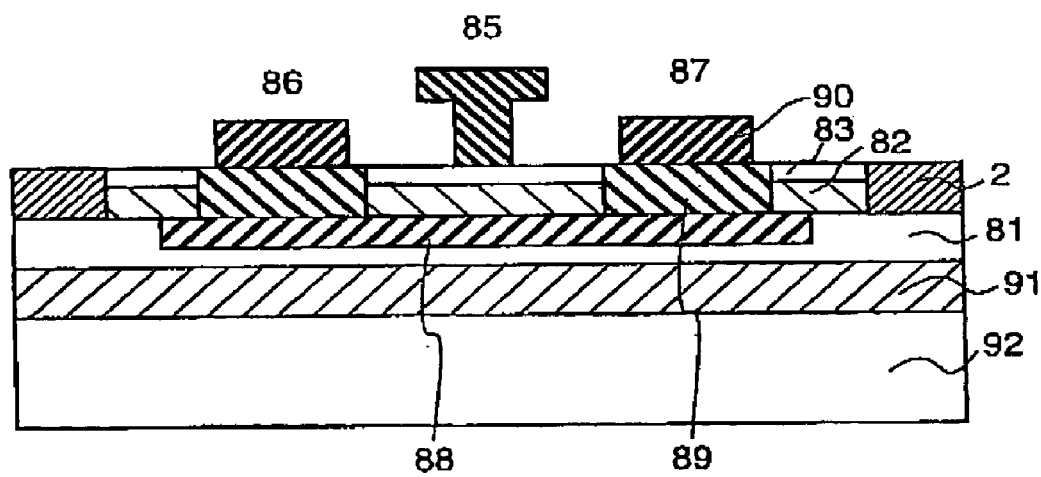
FIG. 14 is a cross-sectional view of a main portion of a field effect semiconductor device according to Embodiment 5 of the invention.

Unlike Embodiment 4, an SOI substrate 200 having an Si layer 81 of 100 nm and a buried insulating film layer 91 of 150 nm is used for the substrate. An SiC layer 83 and an (SiGe)C layer 82 are formed above the substrate in the same manners as in Embodiment 4. As a result, the layered structure comprises, from the side of the surface, an SiC layer 83 of 5 nm thick, an (SiGe)C layer 82 of 70 nm thick (the ratio of Si to Ge ratio is 95:5), an Si layer 81 of 100 nm thick, a buried insulating film 91 of 150 nm thick and an Si support substrate 92 of 725 μm in this order. FIG. 14 schematically shows the cross-sectional structure of this semiconductor device. Manufacturing steps of the field effect semiconductor device for the layered structure described above are the same as those in Embodiment 4.

Figure 15:
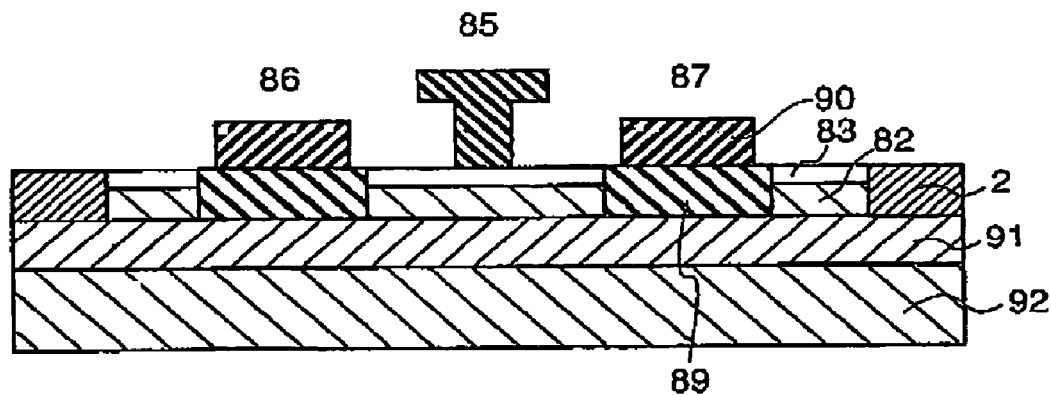
FIG. 15 is a cross-sectional view of a main portion of another field effect semiconductor device according to Embodiment 5 of the invention.

FIG. 15 shows an example of a field effect semiconductor device of another configuration using an SOI substrate. In a case of forming an (SiGe)C layer 82 and an SiC layer 83 using an SOI substrate 200 having a surface Si layer 81 of as thin as 20 nm, when the growing temperature is increased up to 1000° C., Ge and C are diffused in the entire Si layer during reaction of forming the (SiGe)C layer 82 on the Si layer 81 to form an (SiGe)C layer 82 of 55 nm thick just above the buried insulative layer 91. The layered structure in this case comprises, from the side of the surface, an SiC layer 83 of 5 nm thick, an (SiGe)C layer of 55 nm thick (the ratio of Si to Ge is 95:5), a buried insulative layer 91 of 150 nm thick, and an Si support substrate 90 of 725 μm thick in this order. Further, unlike the manufacturing steps for Embodiment 4, the step of implanting B impurities to the Si layer is no longer necessary. Since the Si layer 81 is not present in contact with the (SiGe)C layer 82, it is probable to cause no punch-through or the like. Other steps are the same as those in Embodiment 4. FIG. 15 schematically shows a cross-sectional structure of this semiconductor device.

Embodiment 6

Figure 16:
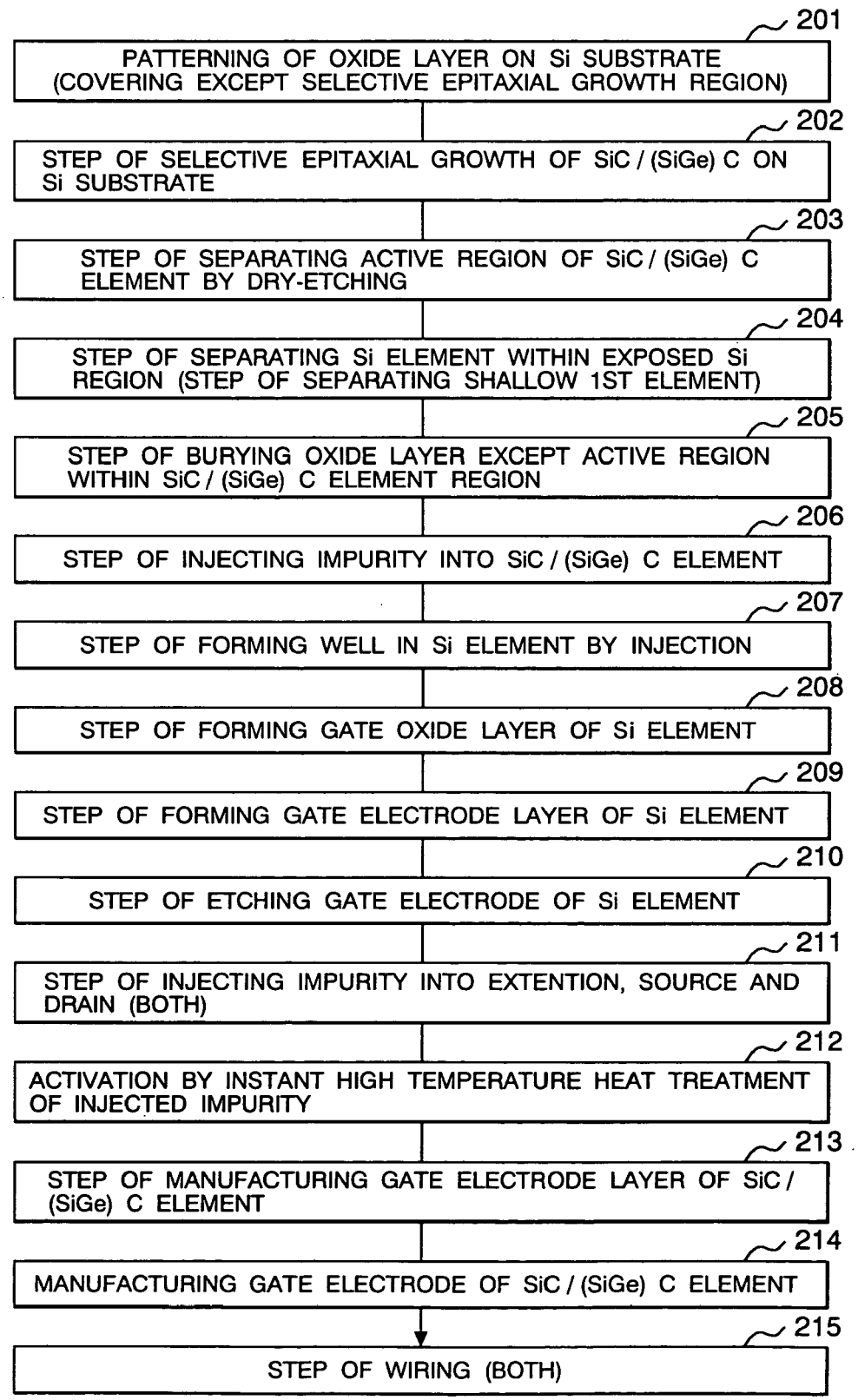
FIG. 16 is a step flow chart showing a method of manufacturing a field effect semiconductor device according to Embodiment 6 of the invention and a usual Si integrated circuit on one and the same chip.
Figure 17:
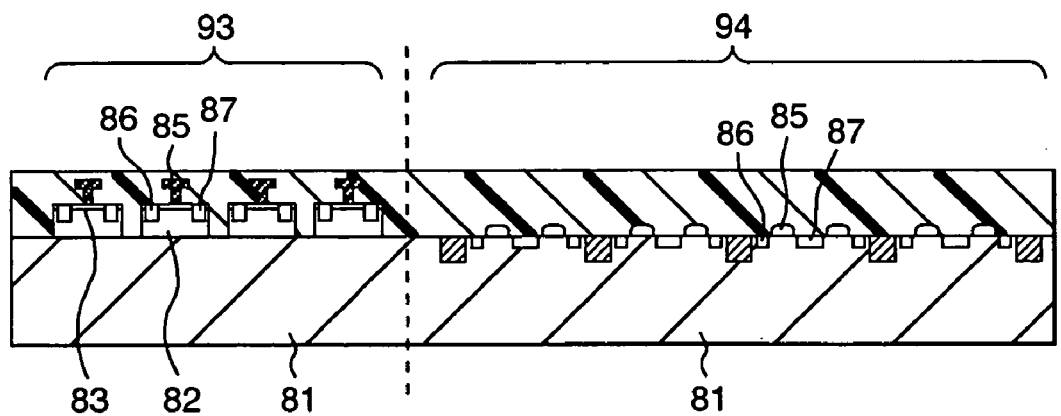
FIG. 17 is a cross sectional view of a semiconductor device in which a field effect semiconductor device according to Embodiment 6 of the invention and a usual Si integrated circuit are formed on one and the same chip.

This embodiment shows a method of manufacturing an SiC/(SiGe)C field effect semiconductor device section 93 of Embodiment 4 and a usual Si integrated circuit section 94 on one and the same chip. FIG. 16 shows the outline of the flow of the manufacturing steps. Further, FIG. 17 schematically shows the cross sectional structure of this semiconductor device.

The SiC/(SiGe)C field effect semiconductor device section 93 and the usual Si integrated circuit section 94 are integrated on a silicon substrate 81. The SiC/(SiGe)C field effect semiconductor device section 93 has a plurality of field effect semiconductor devices each having an (SiGe)C channel layer 82 and an SiC barrier layer. A gate electrode 85, a source electrode 86, and a drain electrode 87 are shown. Also in the Si integrated circuit section 94, a plurality of field effect semiconductor devices are arranged each having a gate electrode 85, a source electrode 86 and a drain electrode 87.

At first, in accordance with the method in Embodiment 4, a process for manufacturing the SiC/(SiGe)C field effect semiconductor device section 93 is proceeded.

An oxide film having an opening is formed on an Si substrate (step 201). That is, regions other than the selective epitaxial growing region are covered with the oxide film having an opening as a feature of the invention. An SiC layer and an (SiC/SiGe)C layer are epitaxially grown selectively on the Si substrate (step 202).

The active regions of the semiconductor device section comprising SiC/(SiGe)C are separated by dry etching (step 203). From the step of separating the active regions of the device by dry etching, a manufacturing step of the usual Si device section is also started. The Si device section manufacturing step in this case is the same as the usual CMOS-LSI manufacturing step.

At the instance the Si surface is exposed in the step described above, an isolation step for Si devices (the so-called shallow trench device isolation step) is added (step 204). At the same time, an oxide film burying treatment is performed on the regions other than the active regions also for the SiC/(SiGe)C devices (step 205).

Then, an impurity implantation step is performed on the SiC/(SiGe)C devices (step 206) and, further, a well injection step is performed on the Si devices (step 207). Then, a gate oxide film forming step for Si devices (step 208), a gate electrode film forming step (209), a gate electrode etching step (210), and an impurity injection step for extensions and source and drain (step 211) are performed successively. Further, impurities implanted so far to the SiC/(SiGe)C device and the Si device are activated by an instantaneous high temperature heat treatment at 1100° C. (step 212). Then, a gate electrode film predetermined fabrication step (213) for the SiC/(SiGe)C devices, a gate electrode fabrication step (214) and a wiring step (215) are performed successively. The step indicated as (for both) in FIG. 16 is a step where the processing is applied in common both for the SiC semiconductor device section and the usual Si semiconductor device section.

As described above, according to the steps, SiC and (SiGe)C semiconductor devices can be manufactured on one and the same chip with no substantial sacrifices of the performance of the usual CMOS.

Embodiment 7

Figure 18:
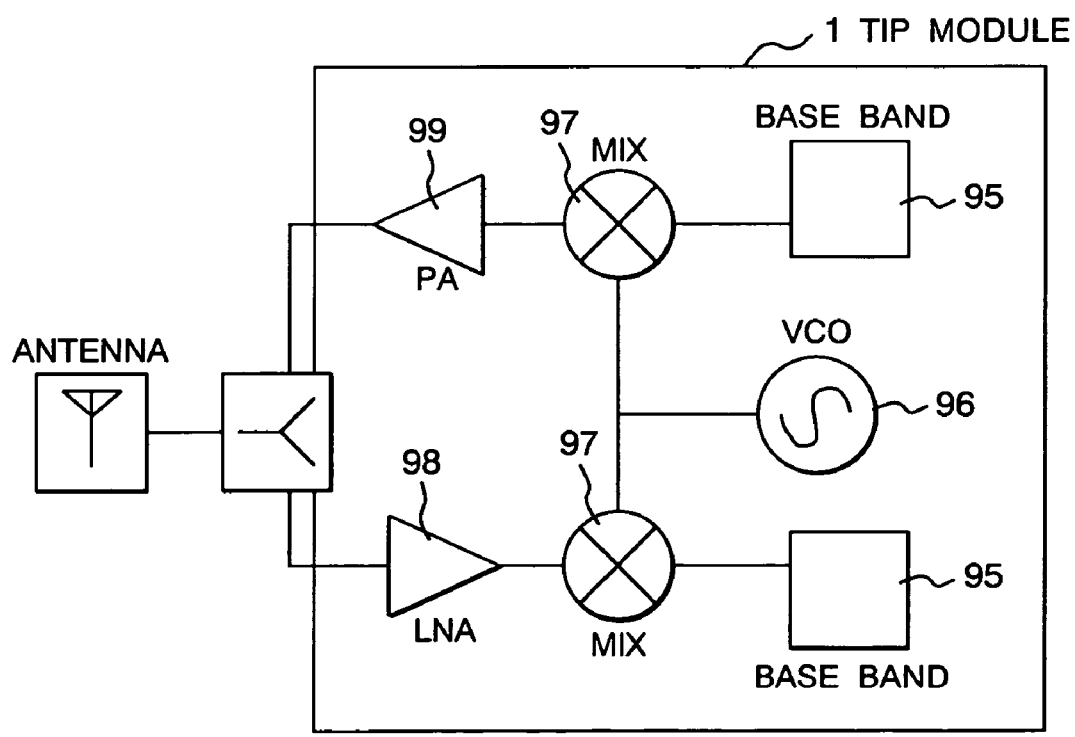
FIG. 18 is a block diagram of a 26 GHz band transmission/reception module for fixed wireless access according to Embodiment 7 of the invention.
Figure 19:
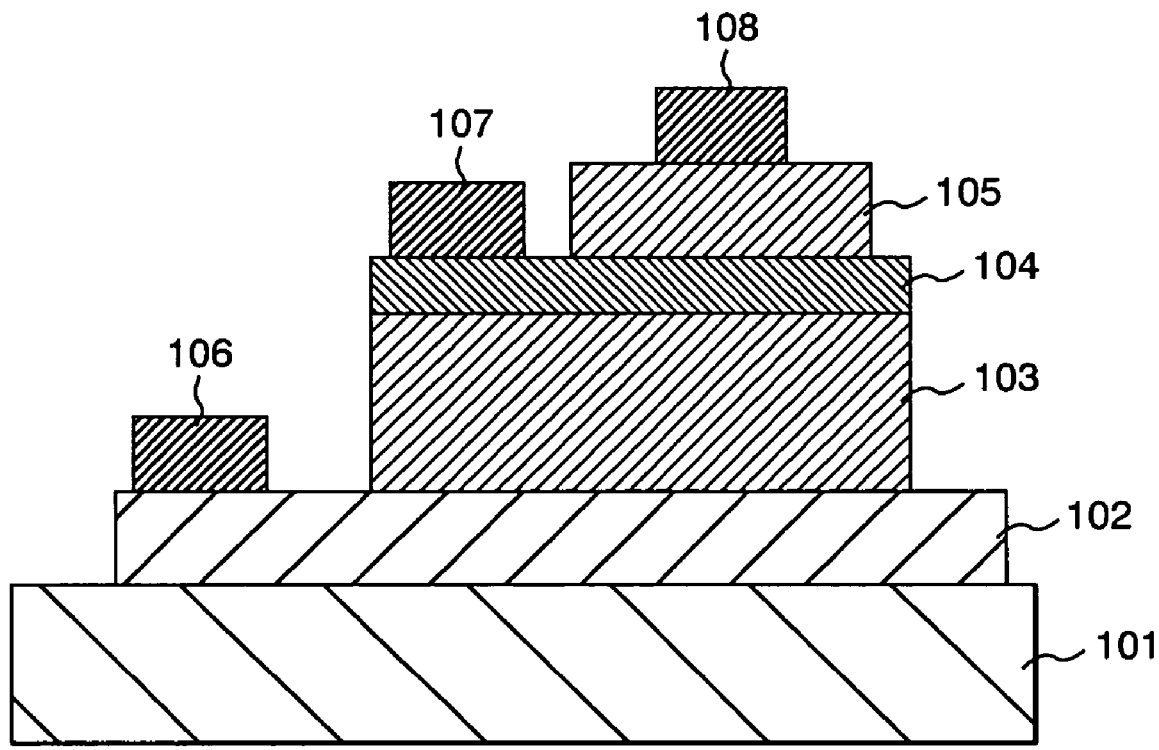
FIG. 19 is a cross-sectional view of an existent semiconductor device.

This embodiment shows an example of a 26 GHz band transmission/reception module for fixed wireless access. In this embodiment, a semiconductor integrated circuit is fabricated by hybridization of an Si semiconductor device section and an SiC semiconductor device section. FIG. 18 shows a block diagram of this module. The module comprises a main constituent sections of a signal processing section 95 of a base band (BB), a voltage controlled oscillator (VCO) 96, a mixer (MIX) 97, a low noise amplifier (LNA) 98, and a power amplifier (PA) 99. Since the configuration of the block per se is ordinary, the detailed descriptions thereof are omitted. Among them, the BB circuit 95 is composed of a usual Si—CMOS. Each of the sections for VCO, MIX, and LNA is composed of a SiGe-HBT, and the PA section is composed of an SiC/(SiGe)C transistor.

The SiGe-HBT is manufactured by a step integrated with a usual Si—CMOS process. Accordingly, all of the circuits are formed on one and the same substrate by the method of Embodiment 6.

A plurality of semiconductor integrated circuits are formed in one and the same wafer and each of the thus manufactured chips is put to dicing to complete an IC for fixed wireless access with a milliwave band.

Subsequently, the IC is mounted on a package substrate for use in milliwave band and by way of steps for mounting a portion of chip parts and wiring in the package, a transmission/reception module is completed.

Various embodiments of the present invention have been described above; those features are summarized as below.

(1) A semiconductor device comprising an insulating film having an opening formed in a substrate, a first single crystal layer disposed in the opening, and a second single crystal layer formed on the first single crystal layer, wherein the first single crystal layer and the second single crystal layer each comprises a single crystal (SiGe)C layer having one or both of Si and Ge, and C as main ingredients and a stoichiometric ratio of the sum of Si and Ge to C being about 1:1, and a forbidden band width of the first single crystal layer is different from that of the second crystal layer.

(2) A semiconductor device comprising an insulating film having an opening formed in a substrate, a first single crystal layer disposed in the opening, a second single crystal layer formed on the first single crystal layer, and a third single crystal layer formed on the second single crystal layer, wherein the first single crystal layer, the second single crystal layer, and the third single crystal layer each comprises a single crystal (SiGe)C layer having one or both of Si and Ge, and C as main ingredients and a stoichiometric ratio of the sum of Si and Ge to C being about 1:1, and a forbidden band width of at least one of the first single crystal layer, the second single crystal layer and the third single crystal layer is different from those of the other layers.

(3) A semiconductor device according to item (2) described above wherein the conduction type of the second single crystal layer is different from that of the third single crystal layer.

(4) A semiconductor device according to item (3) described above wherein the forbidden band width of the second crystal layer is smaller than that of the third crystal layer.

(5) A semiconductor device according to any one of items (2) to (4) described above wherein the first single crystal layer is a collector of a bipolar transistor, the second single crystal layer is a base of the bipolar transistor and the third single crystal layer is an emitter of the bipolar transistor.

(6) A semiconductor device according to any one of items (1) to (5) described above wherein a Ge compositional ratio changes in the first single crystal layer.

(7) A semiconductor device according to any one of items (1) to (5) described above wherein a Ge compositional ratio changes in the second single crystal layer.

(8) A semiconductor device according to any one of items (2) to (5) described above wherein a Ge compositional ratio changes in the third single crystal layer.

(9) A semiconductor device according to any one of items (1) to (5) described above wherein the first single crystal is formed on Si.

(10) A semiconductor device including: a hetero junction portion in which an SiC layer having a stoichiometric ratio of Si to C being about 1:1 and an (SiGe)C layer having a stoichiometric ratio of the sum of Si and Ge to C being about 1:1 are layered alternately; a gate electrode above a surface side layer of both the layers forming the hetero junction portion; a channel through which current flows formed at a portion facing the gate electrode in one or both of the SiC layer and the (SiGe)C layer; and source and drain regions formed within the main surface of the hetero junction portion so as to be in electrical contact with the channel.

(11) A semiconductor device according to item (10) described above including a buried channels structure in which a channel layer is formed in one, having a narrow forbidden band width, of the SiC layer and the (SiGe)C layer, the other having a large forbidden band layer is formed above the channel layer to form a barrier layer, and a gate electrode is formed further thereon.

(12) A semiconductor device having a layered structure including one or both of an SiC layer comprising Si, C and a slight amount of impurities and an Si—Ge—C layer comprising Si, Ge, C and a slight amount of impurities, one of the SiC layer and the Si—GE-C layer being layered on a high-concentration p-Si layer, wherein a gate electrode is disposed above the surface side layer, a channel through which current flows formed at a portion facing the gate electrode in one or both of the SiC layer and the Si—Ge—C layer, and a source and a drain regions are formed in a main surface of the layered structure so as to be in electrical contact with the channel.

(13) A semiconductor device according to item (12) described above wherein a stoichiometric ratio of Si to C in the Si—C layer is about 1:1, and a stoichiometric ratio of the sum of Si and Ge to C in the Si—Ge—C layer is about 1:1.

(14) A semiconductor device according to item (10) or (11) described above wherein one of the SiC layer and the (SiGe)C layer forming the hetero junction portion is formed on Si.

(15) A semiconductor device according to item (10) or (11) described above wherein the gate electrode is in direct contact with a surface side layer of the SiC layer and the (SiGe)C layer forming the hetero junction to form a Schottky barrier.

(16) A semiconductor device according to item (10) or (11) described above wherein an insulative layer is formed in the boundary between the gate electrode and a surface side layer of the SiC layer and the (SiGe)C layer forming the hetero junction portion.

(17) A semiconductor device according to item (10) or (11) described above wherein a metal silicide compound is in contact with the SiC layer and the (SiGe)C layer at a high-impurity concentration formed by the source and the drain for intended electric contact.

(18) A semiconductor device according to item (10) or (11) described above wherein a region formed by the source and the drain is formed partially or entirely of a metal silicide so as to make electric contact with the channel.

(19) A semiconductor device according to any one of items (1) to (8) described above wherein an SiGeC layer comprising one or both of Si and Ge, and C as main ingredients is present between the Si semiconductor substrate and the first single crystal layer, and the lattice constant of the Si semiconductor substrate is different from that of the first single crystal layer.

(20) A semiconductor device according to any one of items (1) to (9) described above wherein the plane direction of the Si semiconductor substrate is substantially (100).

(21) A semiconductor-device according to any one of (1) to (20) described above wherein a buried insulating film layer is formed in the Si layer in contact with the SiC layer or the (SiGe)C layer at the boundary opposite to the boundary described above.

(22) A semiconductor device according to any one of items (1) to (20) described above wherein the layer in contact with the SiC layer or the (SiGe)C layer is a porous Si layer.

(23) A semiconductor device according to any one of (1) to (22) described above wherein the region in which the SiC layer or (SiGe)C layer is formed is a partial region of the substrate.

(24) A semiconductor integrated circuit wherein a semiconductor device according to any one of items (1) to (23)

described above and a semiconductor device using Si as an operation active layer are formed on one and the same support substrate.

(25) A semiconductor circuit module comprising a semiconductor device according to any one of items (1) to (24) described above and a semiconductor integrated circuit as main constituent parts.

(26) A method of manufacturing a semiconductor device comprising the steps of forming an insulating film having an opening in an Si semiconductor substrate, forming a first single crystal layer in the opening, and forming a second single crystal layer on the first single crystal layer, in which the first single crystal layer and the second single crystal layer each has a single crystal (SiGe)C layer comprising one or both of Si and Ge, and C as main ingredients, and having a stoichiometric ratio of the sum of Si and Ge to C being about 1:1, and the forbidden band width of the first single crystal layer is different from that of second single crystal layer.

(27) A method of manufacturing a semiconductor device comprising the steps of forming an insulating film having an opening on an Si semiconductor substrate, forming a first single crystal layer in the opening, forming a second single crystal layer on the first single crystal layer, and forming a third single crystal layer on the second single crystal layer, in which the first single crystal layer, the second single crystal layer, and the third single crystal layer each has a single crystal (SiGe)C layer comprising one or both of Si and Ge, and C as main ingredients, and having a stoichiometric ratio of the sum of Si and Ge, and C being about 1:1, and a forbidden band width of at least one of the first single crystal layer, the second single crystal layer, and the third single crystal layer is different from those of the other layers.

(28) A method of manufacturing a semiconductor device according to any one of (1) to (25) described above, wherein a starting material contains a gas containing an Si atom-C atom bond.

(29) A method of manufacturing a semiconductor device according to any one of items (1) to (25) described above, wherein a starting material contains a gas containing an Ge atom-C atom bond.

(30) A method of manufacturing a semiconductor device according to any one of items (1) to (25) described above, wherein the multi-layered structure is formed by epitaxial growing and the growing temperature for the epitaxial growing is from 500 to 900° C.

(31) A method of manufacturing a semiconductor device according to any one of items (1) to (25) described above, wherein the multi-layered structure is formed by epitaxial growing and the growing pressure for the epitaxial growing is within a range from 0.1 to 10,000 Pa.

While the present invention has been described by way of various preferred embodiments, it will be apparent that the invention is not restricted only to such embodiments but various design changes can be made within the scope not departing from the sprit of the invention.

As apparent from the embodiments described above, since the invention can form a hetero junction of good crystallinity by a semiconductor having high electron saturation speed and large forbidden band width, operation speed and voltage withstanding of the semiconductor device using the hetero junction can be improved. As a result, performance of high frequency amplifying semiconductor devices and integrated circuits for use in wireless communication apparatus, particularly, large forbidden band width semiconductor devices for use in quasi-milliwave to milliwave region wireless communication can be improved remarkably.

The present invention can provide a semiconductor device having a single crystal layer containing Si, Ge and C with good crystallinity on an Si substrate and exhibiting favorable high frequency characteristics, as well as a manufacturing method thereof.

In another aspect, the present invention can provide a semiconductor device having a single crystal layer containing Si, Ge, and C with good crystallinity on an Si substrate and exhibiting good high frequency characteristics and high speed operation, as well as a manufacturing method thereof Brief description of reference numerals is made as follows:

1, 11, 51, 101 . . . Si substrate, 2, 30, 66, 68, 69, 71, 73 . . . insulating film, 3, 4 . . . single crystal (SiGe)C layer, 5 . . . (SiGe)C buffer layer, 6 . . . opening, 12, 23, 52, 60 . . . collector region (n-single crystal Si), 13, 53 . . . low concentration collector layer (low concentration n-single crystal Si), 14, 16, 17, 54, 56, 57 . . . device isolation insulating film, 15, 55 . . . collector extension layer (high concentration n-single crystal Si), 18, 19, 58, 59 . . . collector base isolation insulating film, 20, 70 . . . base extension electrode (p-polycrystal Si), 21, 22 . . . emitter base isolation insulating film, 24, 61 . . . collector layer (n-single crystal (SiGe)C), 25, 65 . . . n-polycrystal (SiGe)C, 26, 62 . . . intrinsic base layer (p-single crystal (SiGe)C), 63 . . . p-polycrystal (SiGe)C, 27 . . . external base layer (p-polycrystal (SiGe)C), 28, 64 . . . emitter layer (n-single crystal SiC), 29, 72 . . . emitter extension layer (high concentration n-polycrystal Si), 31, 74, 108 . . . emitter electrode, 32, 75, 107 . . . base electrode, 33, 76, 106 . . . collector electrode, 67 . . . polycrystal layer, 81 . . . Si layer, 82 . . . (SiGe)C channel layer, 83 . . . SiC barrier layer, 84 . . . forbidden band width, 85 . . . gate electrode, 86 . . . source electrode, 87 . . . drain electrode, 88 . . . high concentration p-region, 89 . . . high concentration n-region, 90 . . . Al electrode, 91 . . . buried insulating film layer, 92 . . . Si support substrate, 93 . . . SiC/(SiGe)C field effect semiconductor device, 94 . . . Si integrated circuit, 95 . . . signal processing portion for base band (BB), 96 . . . voltage controlled oscillator (VCD), 97 . . . mixer (MIX), 98 . . . low noise amplifier (LNA), 99 . . . power amplifier (PA), 102 . . . high concentration n-Si, 103 . . . collector region (n-Si), 104 . . . base region (p-SiGe), 105 . . . emitter region (n-SiGeC), 110 . . . load lock chamber, 111 . . . transfer chamber, 112 . . . growing chamber 1, 113 . . . growing chamber 2, 200 . . . SOI substrate.

What is claimed is:

1. A semiconductor device comprising:
an Si semiconductor substrate;
an insulating film having an opening formed on the Si semiconductor substrate;
a first single crystal layer disposed in the opening; and
a second single crystal layer formed on the first single crystal layer;
wherein the first single crystal layer and the second single crystal layer each comprises a single crystal (SiGe)C layer having one or both of Si and Ge, and C as essential constituent ingredients, and a stoichiometric ratio of the sum of Si and Ge to C being about 1:1, and a forbidden band width of the first single crystal layer is different from that of the second crystal layer.

2. A semiconductor device comprising:
an Si semiconductor substrate;
an insulating film having an opening formed on the Si semiconductor substrate;

a first single crystal layer disposed in the opening;
a second single crystal layer formed on the first single crystal layer; and
a third single crystal layer formed on the second single crystal layer;
wherein the first single crystal layer, the second single crystal layer, and the third single crystal layer each comprises a single crystal (SiGe)C layer having one or both of Si and Ge, and C as essential constituent ingredients, and a stoichiometric ratio of the sum of Si and Ge to C being about 1:1, and a forbidden band width of at least one of the first single crystal layer, the second single crystal layer, and the third single crystal layer is different from those of the other layers.

3. A semiconductor device according to claim 2, wherein a conductivity type of the second single crystal layer is different from that of the third single crystal layer.

4. A semiconductor device according to claim 3, wherein a forbidden band width of the second crystal layer is smaller than that of the third crystal layer.

5. A semiconductor device according to claim 1 wherein a gate electrode is present on the second single crystal layer, a channel layer through which current flows is formed at a portion facing the gate electrode in one or both of the first single crystal layer and the second single crystal layer, and a source region and a drain region are formed in a main surface of a hetero junction portion formed of the first single crystal layer and the second single crystal layer so as to make electric contact with the channel layer.

6. A semiconductor device according to claim 5, wherein the channel layer is formed in one, having a smaller forbidden band width, of the first single crystal layer and the second single crystal layer and the other having a larger forbidden band width is formed as a barrier layer above the channel layer, and the gate electrode is present above the barrier layer.

7. A semiconductor device comprising:
an Si semiconductor substrate;
an insulating film having an opening formed on the Si semiconductor substrate;
a layered structure including one or both of the first single crystal layer formed in the opening and the second single crystal layer formed on the first single crystal layer;
a gate electrode formed on the second single crystal layer,
a channel region formed at a portion facing the gate electrode in one or both of the first single crystal layer and the second single crystal layer,
wherein the first single crystal layer and the second single crystal layer each comprises a single crystal (SiGe)C layer having a stoichiometric ratio of the sum of Si and Ge to C being about 1:1; and
a source electrode and a drain electrode interposing the gate electrode therebetween.

8. A semiconductor device according to claim 7, wherein an SiGeC layer comprising one or both of Si and Ge, and C as essential constituent ingredients is present between the Si semiconductor substrate and the first single crystal layer, and a lattice constant of the Si semiconductor substrate is different from that of the first single crystal layer.

9. A semiconductor device according to claim 1, wherein a plane orientation of the Si semiconductor substrate is (100).

10. A semiconductor integrated circuit device comprising:
a semiconductor device, said semiconductor device including:
an Si semiconductor substrate;
a first semiconductor device comprising:
an insulating film having an opening formed on the Si semiconductor substrate;
a first single crystal layer disposed in the opening; and
a second single crystal layer formed on the first single crystal layer;
wherein the first single crystal layer and the second single crystal layer each comprises a single crystal (SiGe)C layer having one or both of Si and Ge, and C as essential constituent ingredients, and a stoichiometric ratio of the sum of Si and Ge to C being about 1:1, and a forbidden band width of the first single crystal layer is different from that of the second crystal layer; and
a second semiconductor device using Si for an operation active layer.

11. A semiconductor circuit module at least having a semiconductor device, said semiconductor device comprising:
an Si semiconductor substrate;
an insulating film having an opening formed on the Si semiconductor substrate;
a first single crystal layer disposed in the opening; and
a second single crystal layer formed on the first single crystal layer;
wherein the first single crystal layer and the second single crystal layer each comprises a single crystal (SiGe)C layer having one or both of Si and Ge, and C as essential constituent ingredients, and a stoichiometric ratio of the sum of Si and Ge to C being about 1:1, and a forbidden band width of the first single crystal layer is different from that of the second crystal layer.

12. A method of manufacturing a semiconductor device comprising the steps of:
forming an insulating film having an opening on an Si semiconductor substrate;
forming a first single crystal layer in the opening; and
forming a second single crystal layer on the first single crystal layer;
wherein the first single crystal layer and the second single crystal layer each has a single crystal (SiGe)C layer comprising one or both of Si, Ge, and C as essential constituent ingredients, and having a stoichiometric ratio of the sum of Si and Ge, and C being about 1:1, and a forbidden band width of the first single crystal layer is different from that of second single crystal layer.

13. A method of manufacturing a semiconductor device comprising the steps of:
forming an insulating film having an opening on an Si semiconductor substrate;
forming a first single crystal layer in the opening;
forming a second single crystal layer on the first single crystal layer; and
forming a third single crystal layer on the second single crystal layer;
wherein the first single crystal layer, the second single crystal layer, and the third single crystal layer each has a single crystal (SiGe)C layer comprising one or both of Si, Ge, and C as essential constituent ingredients, and having a stoichiometric ratio of the sum for Si and Ge to C being about 1:1, and a forbidden band width of at least one of the first single crystal layer, the second single crystal layer, and the third single crystal layer is different from those of the other layers.

14. A method of manufacturing a semiconductor device according to claim 13, wherein in the steps of forming the first single crystal layer and forming the second single crystal layer, a starting gas contains an organic compound gas having an Si atom-C atom bond, or both of an organic compound gas having an Si atom-C atom bond and an organic compound gas having a Ge atom-C atom bond.

15. A method of manufacturing a semiconductor device according to claim 13, wherein in the steps of forming the first single crystal layer and forming the second single crystal layer, a starting gas contains an organic gas having an Si atom-C atom bond.

16. A method of manufacturing a semiconductor device according to claim 13, wherein in the steps of forming the first single crystal layer and forming the second single crystal layer, a starting gas contains an organic gas having a Ge atom-C atom bond.

* * * * *